(12) United States Patent
Venegas et al.

(10) Patent No.: US 6,856,505 B1
(45) Date of Patent: Feb. 15, 2005

(54) MOLDED CABLE MANAGEMENT ARM FOR A SERVER SYSTEM RACK

(75) Inventors: Alfredo Venegas, Cypress, TX (US); Julian S. Baiza, Arlington, TX (US)

(73) Assignee: Central Industrial Supply Company, Grand Prairie, TX (US)

( * ) Notice: Subject to any disclaimer, the term of this patent is extended or adjusted under 35 U.S.C. 154(b) by 30 days.

(21) Appl. No.: 09/876,349

(22) Filed: Jun. 7, 2001

Related U.S. Application Data

(63) Continuation of application No. 09/843,663, filed on Apr. 26, 2001, now Pat. No. 6,442,030.

(51) Int. Cl.[7] ................................................. G06F 1/16
(52) U.S. Cl. ......................... 361/683; 361/679; 361/724
(58) Field of Search ........................ 361/679, 683–686, 361/724–727

(56) References Cited

U.S. PATENT DOCUMENTS

| | | | | |
|---|---|---|---|---|
| 5,152,443 A | * | 10/1992 | Hagan | ........................ 224/252 |
| 6,021,047 A | * | 2/2000 | Lopez et al. | ................. 361/727 |
| 6,305,556 B1 | * | 10/2001 | Mayer | .......................... 211/26 |
| 6,327,139 B1 | * | 12/2001 | Champion et al. | ........... 361/608 |
| 6,353,532 B1 | * | 3/2002 | Landrum et al. | ............ 361/683 |

* cited by examiner

Primary Examiner—Yean-Hsi Chang
(74) Attorney, Agent, or Firm—Chauza & Handley, LLP; Mark W. Handley

(57) ABSTRACT

A drawer (20) of a server system rack (12) includes a flexible cable management arm (114) which is molded of plastic for securing cabling (34) between a moveable tray (38) and an electronic switch (30). The molded cable management arm (114) is preferably formed as a single member (116) having hinges which are defined by hinge regions (120). The hinge regions (120) have oppositely disposed grooves (121, 123), which are formed in opposite sides of the single member (116). Cable retention tabs (140) are integrally molded into the single member (116) and are L-shaped. Adjacent ones of the cable retention tabs (140) extend from alternating ones of opposite edges (142) of the single member (116), with outer portions (144) of the retention tabs (140) extending across and spaced apart from a main body portion (145) of the molded plastic cable management arm (114).

26 Claims, 14 Drawing Sheets

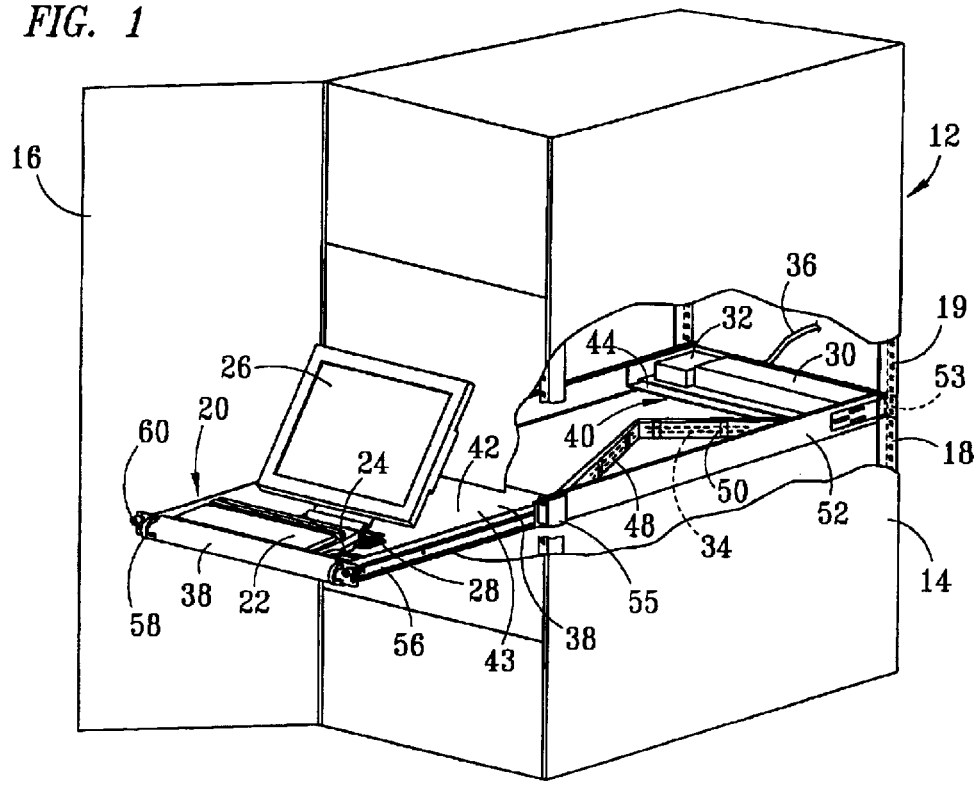
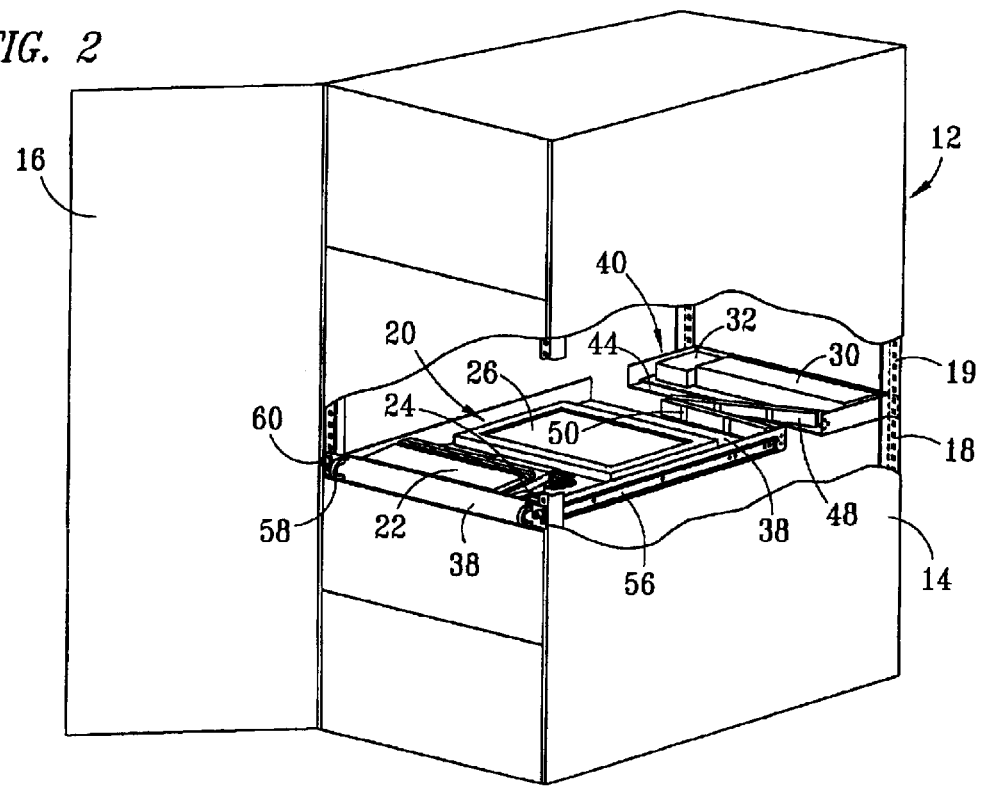

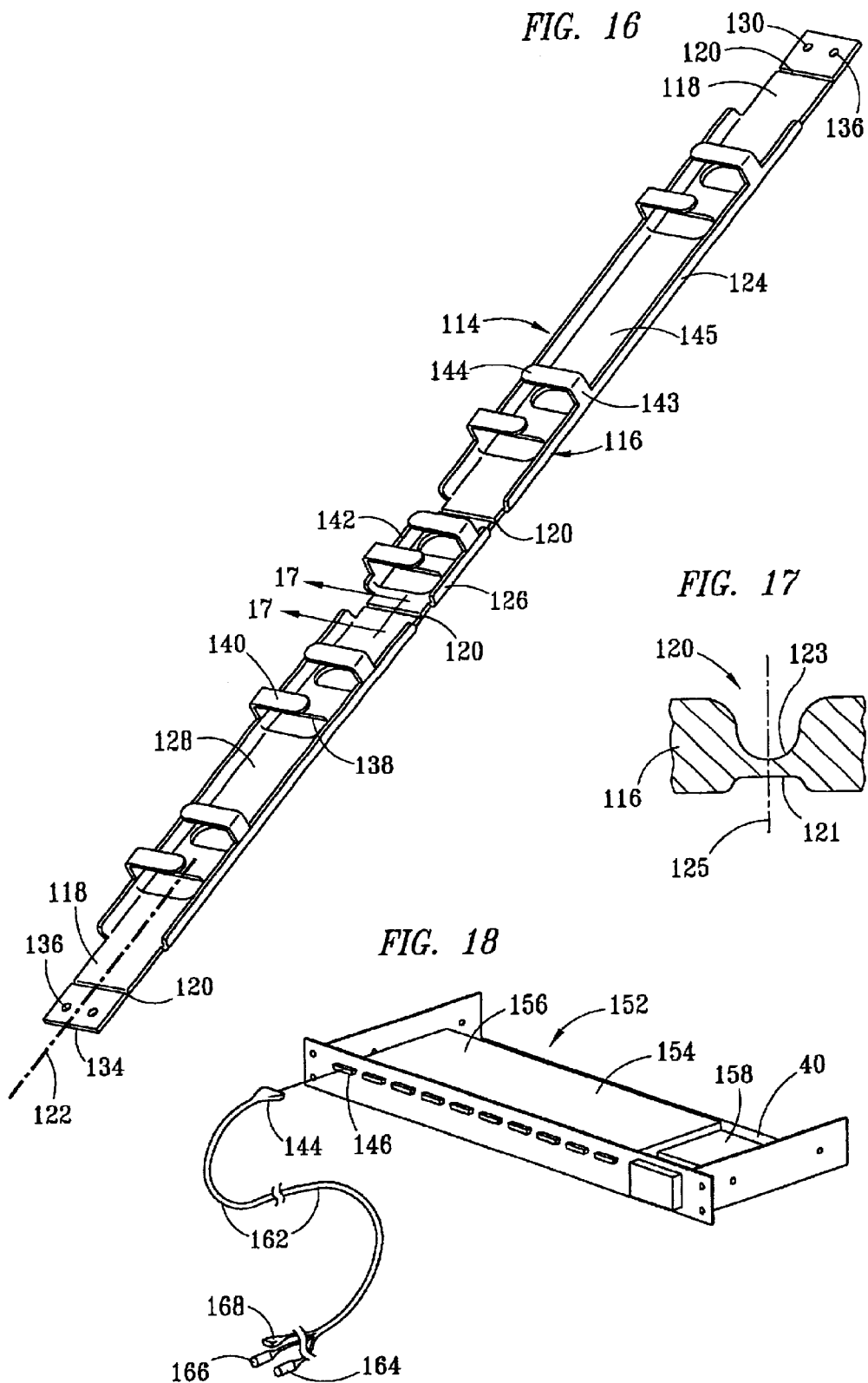

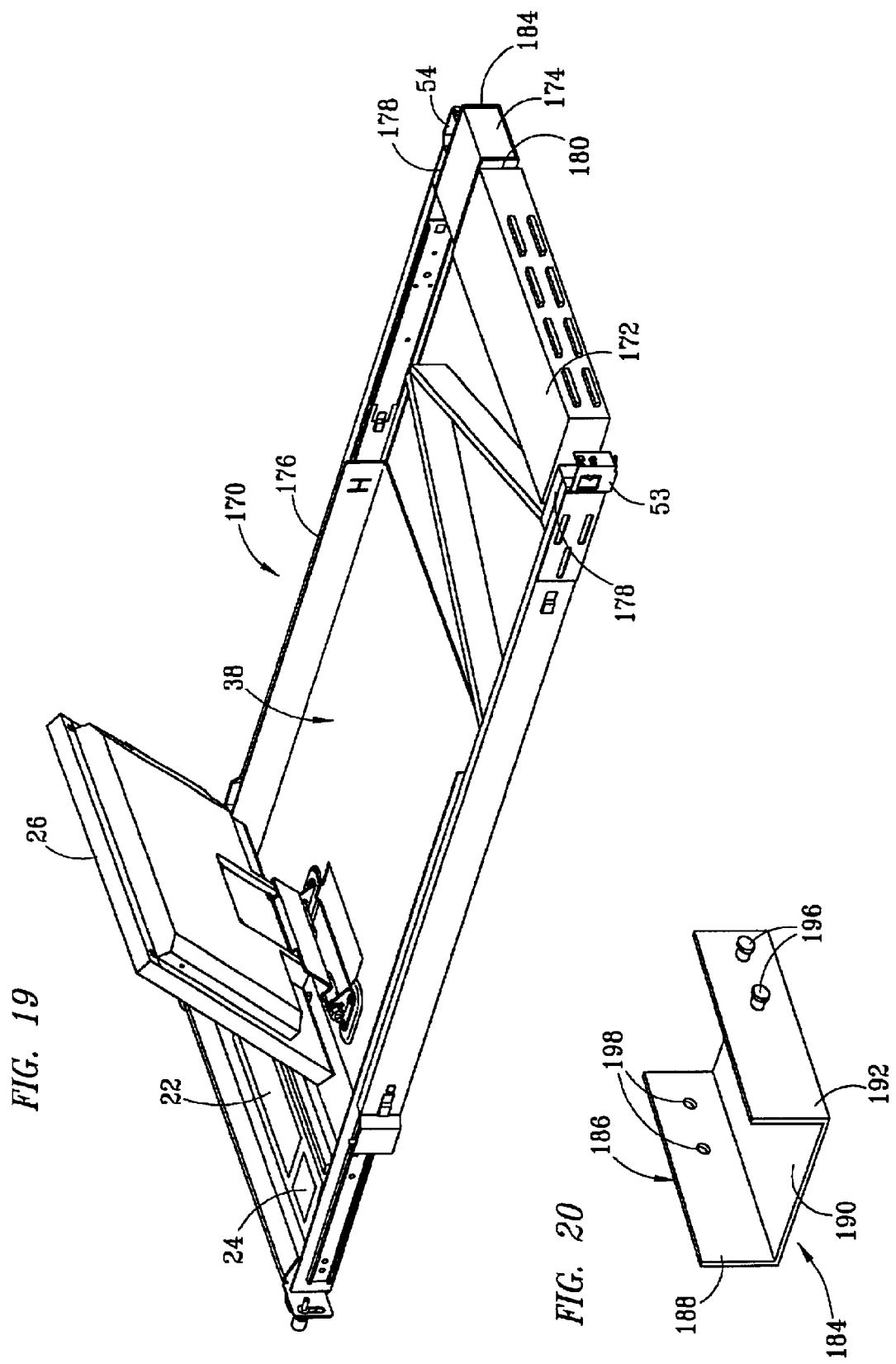

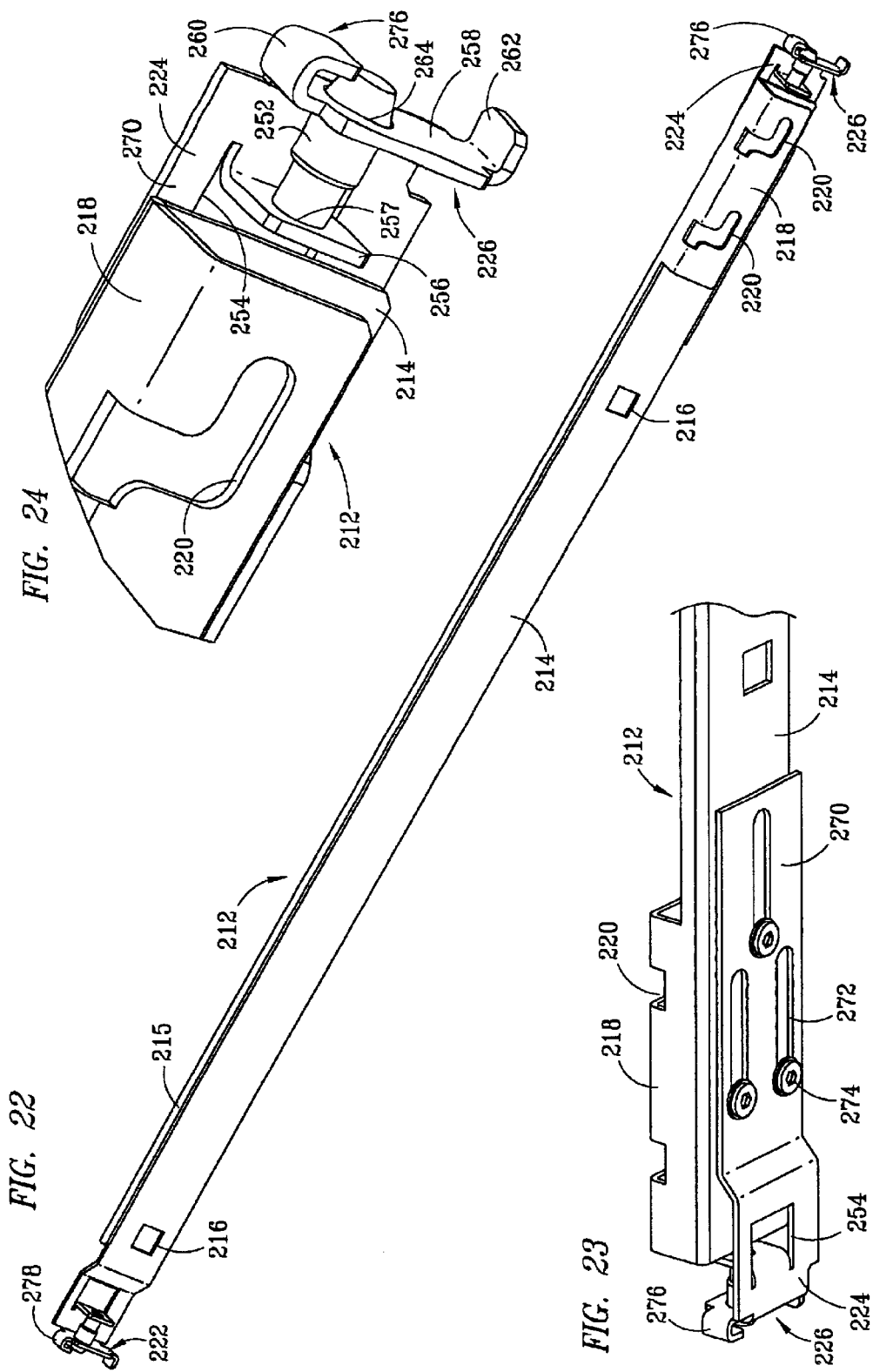

MOLDED CABLE MANAGEMENT ARM FOR A SERVER SYSTEM RACK

CROSS-REFERENCE TO RELATED APPLICATIONS

The present application is a continuation of U.S. application Ser. No. 09/843,663, filed Apr. 26, 2001, now U.S. Pat. No. 6,442,030 entitled "SERVER SYSTEM RACK DRAWER WITH KEYBOARD, FLAT PANEL DISPLAY AND ELECTRONIC SWITCH," invented by Mammoser, Devine and Baiza, and is related to U.S. application Ser. No. 09/876,350, filed Jun. 7, 2001, entitled "MOUNTING BRACKET HAVING A TAPERED PLUNGER LATCH," invented by Baiza and Devine.

TECHNICAL FIELD OF THE INVENTION

The present invention relates in general to hardware for computer systems, and, in particular, to molded cable management arm for a server system rack.

BACKGROUND OF THE INVENTION

Server system racks have been provided for housing equipment, such as network server systems, telephone switch gear, power supplies, and the like. Industry standards have been adopted for server system racks, including adopting of a standard unit size for vertical heights, horizontal widths and horizontal depths of system racks. One such standard size for racks is a width of nineteen inches. The vertical height of components for installing into server system racks is typically expressed in terms of a standard vertical unit of measure "U" which corresponds to 1.75 inches. Various components have been secured to the server system racks using threaded fasteners, which have included bolts and screws that require hand tools to secure the various components to the server system racks. Components can be assembled to serve system racks much more quickly and efficiently without using fasteners that require hand tools. Such components for securing within server system racks have included input devices, such as keyboards, and output devices, such as video display monitors. Prior art keyboards and display monitors can occupy large amounts of space in server system racks. Recently, flat panel displays have been used to provide display monitors of smaller size for mounting within drawers of server system racks. The flat panel displays have been pivotally mounted to the drawers, such that the monitors may be disposed in a horizontal position for storage, and then raised to an upright position for viewing once the drawer is pulled outward of the server system rack. Input and output devices, such as keyboards, mice, touch pads and display monitors, are connected to the servers used in a server system rack to allow users to access the servers. Cables are used to connect between stationary portions of the server system racks and the input and output devices mounted to the drawers which move relative to the server system racks. Cable management arms have been provided for securing the cables between the movable drawers and the stationary portions of the server system racks.

SUMMARY OF THE INVENTION

A one-U vertical height monitor and keyboard drawer for a server system rack includes a movable tray and an electronic switch. The moveable tray and the electronic switch are mounted to the server system rack by a set of mounting rails, which are preferably self-adjusting. Telescoping slide assemblies are mounted to the mounting rails and slidably secure the tray to the server system rack for moving from an inward position, disposed within the rack, to an extended position, extending outward of the rack. A keyboard and a flat panel display are mounted to the tray, with the flat panel display being pivotally mounted to the tray for moving from a downward, storage position into an upright, viewing position. The electronic switch is fixedly mounted to the mounting rails, rearward of the tray, such that the electronic switch is stationary with respect to the mounting rails and the server system rack. The electronic switch is preferably secured to a stationary mount, such as a shelf or mounting bracket, which is secured to the mounting rails. The electronic switch is selectively operated to connect the keyboard and the flat panel display to various ones of the keyboard and monitor connectors of respective servers.

A plastic, molded, flexible cable management arm is secure between the rear of the tray and the electronic switch for securing cabling which connects the electronic switch to the keyboard and the flat panel display. The flexible cable management arm is preferably formed of a single member, provided by a single piece of molded plastic, with hinges molded directly into the single piece of molded plastic. The hinges are provide by oppositely disposed grooves, formed in opposite sides of hinge regions of the single piece of molded plastic. Cable retention tabs are integrally molded into the single piece of molded plastic to define L-shaped tab members. Adjacent ones of the cable retention tabs extend from alternating ones of opposite edges of the single piece of molded plastic, with outer portions of the tab members extending across the single piece of molded plastic, spaced apart from a main body portion of the molded plastic cable management arm. Apertures are formed into the main body of the single piece of molded plastic, with one of the apertures being disposed adjacent to each of the cable retention tabs.

Mounting brackets with toolless fastening are included as part of self-adjusting mounting rails which secure the drawer to the server system rack. The mounting brackets have elongated bodies for slidably securing to respective mounting rails. The brackets and the mounting rails extend between posts of a rack frame of the server system rack. Latch members are slidably secured to respective ones of the mounting brackets to provide a toolless fastening feature, for lineally moving with respect to the elongated bodies of the brackets to selectively secure ends of the mounting rails to the rack frame. The latch members may be provided by plungers having tapered surfaces. Guide surfaces slidable engage the latch members retain the latch members for moving in lineal directions with respect to the mounting brackets and the mounting rails to which respective ones of the latch members are slidably secured.

BRIEF DESCRIPTION OF THE DRAWINGS

For a more complete understanding of the present invention and the advantages thereof, reference is now made to the following description taken in conjunction with the accompanying drawings in which:

FIG. 1 is a cutaway view of a server system rack having a drawer which includes a keyboard, a flat panel display and an electronic switch, showing the drawer in an extended position and the flat panel display in an upward, viewing position;

FIG. 2 is a cutaway view of the server system rack of FIG. 1, showing the drawer in an inward position and the flat panel display in a downward, stowed position;

FIG. 16 is a perspective view of a one piece, flexible, molded plastic cable management arm of the alternative drawer of the server system rack;

FIG. 17 is a partial, section view of the molded cable management arm, taken along section line 17—17 of FIG. 16;

FIG. 18 is a rearward view of an alternative embodiment for an electronic switch and cabling for use with the drawer of the server system rack;

FIG. 19 is a rearward view of a second alternative drawer for a server system rack;

FIG. 20 is a rearward view of a third alternative drawer for a server system rack;

FIG. 22 is a perspective view of an alternative left-hand mounting rail having a mounting bracket which includes a toolless, tapered plunger latch;

FIG. 23 is a partial, perspective view of the alternative mounting rail and the toolless mounting bracket with the tapered plunger latch;

FIG. 24 is a partial perspective view of the alternative mounting rail, showing a rearwardly disposed left-hand mounting bracket having a toolless, tapered plunger latch;

DETAILED DESCRIPTION OF THE INVENTION

Figure 3:
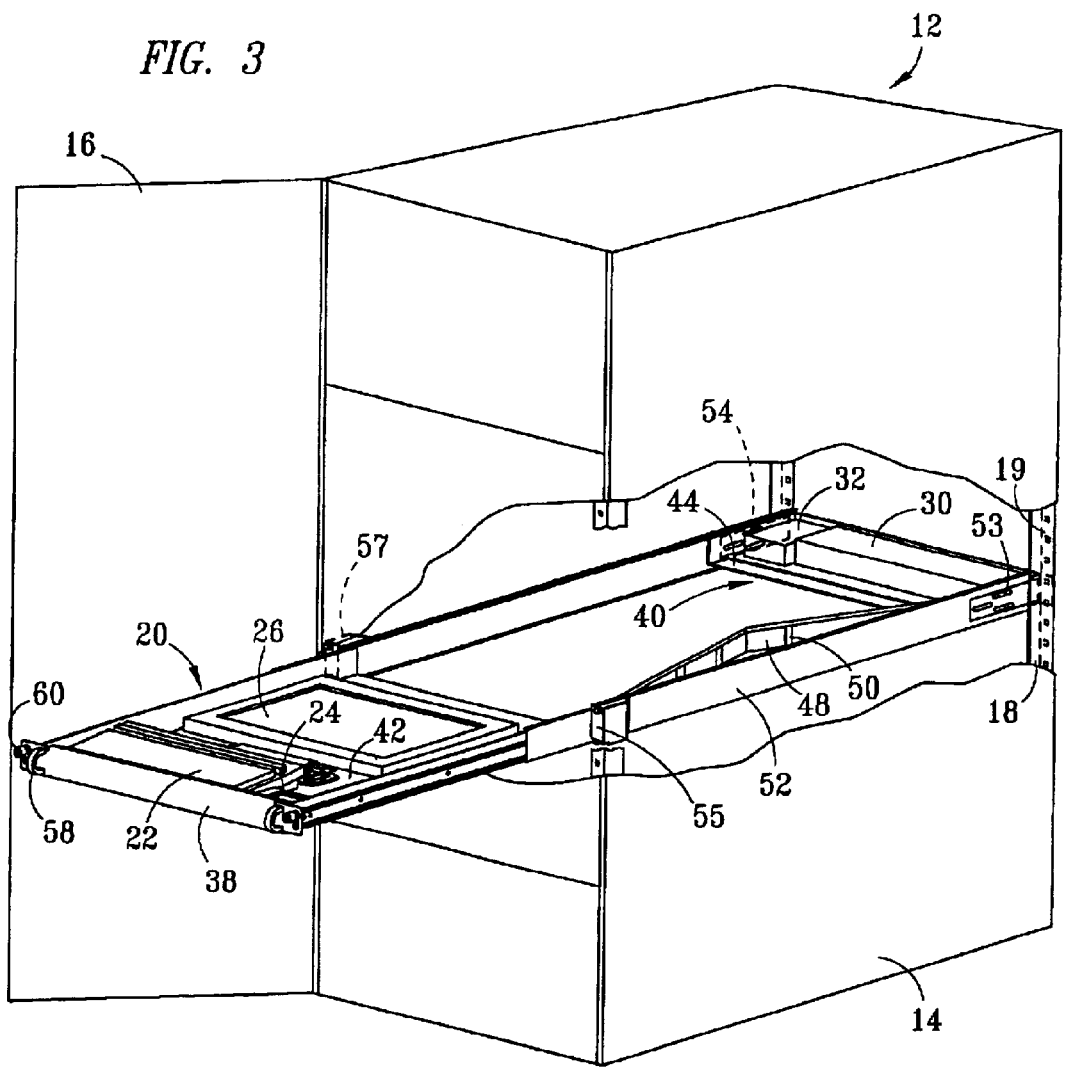
FIG. 3 is a cutaway view of the cabinet in FIG. 1. showing the drawer in a fully extended, outward position.

FIGS. 1 through 3 are cutaway views of a server system rack 12 having a drawer 20 which is moveable into various positions. The server system rack 12 is of a type which is commonly used in network server systems, telephone switch gear, power supplies, and the like. The server system rack 12 includes an enclosure 14, a door 16 and a rack frame 18. The rack frame 18 is of the type having regularly spaced apertures 19. The drawer 20 is mounted to the rack frame 18 such that the drawer 20 is slidably extensible from within the enclosure 14. The drawer 20 has a standard, one-U vertical height. The width of the server system rack 12 may be of any size, such as for fitting within a standard nineteen inch wide rack. In a first embodiment, the drawer 20 includes a movable tray 38 and a stationary mount provided by a stationary shelf 40. In other embodiments, some of which are discussed below, stationary mounting means other than a stationary shelf 40 may be provided.

A keyboard 22, a pointing device 24, such as a mouse, and a flat panel display 26 provide interface devices which are mounted to the movable tray 38. The keyboard 22 and the pointing device 24 each provide respective input devices, which may be included in a single unit in some embodiments. Other types of input devices may also be used, such as touch screens, touch pads, audio microphones, and the like. The flat panel display 26 provides a display monitor which is pivotally mounted to the drawer 20 by a pivot mounting bracket 28, such that the flat panel display 26 may be moved between a downward, stowed position (shown in FIGS. 2 and 3), and an upright, viewing position (shown in FIG. 1). An electronic switch 30 and a power supply 32 are mounted to the stationary shelf 40 of the drawer 20. In some embodiments, the power supply 32 may be mounted to the moveable tray 38. The stationery shelf is a stationery mount which provides stationary mounting means for securing the electronic switch 30 and the power supply 32 to mounting rails 52, in fixed relation to the mounting rails 52, such that the electronic switch 30 and the power supply 32 remain in a stationary position with respect to the mounting rails 52. The electronic switch 30 is provided by a switching unit which is selectively operable for selectively connecting the keyboard 22, the pointing device 24 and the flat panel display 26 to separate ones of the various servers which are interconnected with the server system rack 12, at separate times. The power supply 32 provides power for the flat panel display 26, and may also optionally provide power to the electronic switch 30. A cable set 34 (shown in phantom in FIG. 1) is provided for connecting the keyboard 22, the pointing device 24 and the flat panel display 26 to the electronic switch 30 and the power supply 32. A plurality of cable sets 36 (one shown in FIG. 1) are provided for connecting the electronic switch 30 to respective ones of various associated servers which are used with the server system rack 12. Typically, one of the cable sets 36 connects between keyboard, display and pointing device connectors of the electronic switch 30 and the keyboard, display and pointing device connectors of one of the associated servers. One of the cable sets 36 is used for the cable set 34. The cable set 34 will in typically include an additional power cable, for providing power between the power supply 32 and the display monitor 26. In embodiments in which the power supply 32 is mounted directly to the moveable tray 38, a power cable will be required for connecting between the power supply 32 and a power source.

The drawer 20 includes the movable tray 38 and the stationary shelf 40, with the shelf 40 disposed rearward of the tray 38. Preferably, the tray 38 has a bottom plate 42 with a planar, upper surface 43. The shelf 40 has a planar, upper surface 44, which is coplanar with the surface 43 of the tray 38. The surfaces 43 and 44 are horizontal surfaces. The surface 44 of the shelf 40 is disposed rearward of the bottom plate 42 of the movable tray 38. A flexible, cable management arm 48 is provided for interconnecting between the tray 38 and the shelf 40, for passing the cable set 34 between the tray 38 and the shelf 40. The flexible cable management arm 48 may be provided by rigid linkages which are pivotally interconnected. Straps 50 secure the cable set 34 to the cable management arm 48.

The tray 38 and the shelf 40 of the drawer 20 are mounted to the rack frame 18 with the mounting rails 52. Preferably, the mounting rails 52 are self-adjusting for fitting within rack frames 18 of various depths. Mounting rails 52 are secured to the rack frame 18 with the mounting brackets 53, 54, 55 and 57. The mounting brackets 53 and 54 include toolless fasteners. The shelf 40 is fixedly mounted to the mounting rails 52 for securing to the rack frame 18, such that the shelf 40 is stationary, that is, the shelf 40 does not move relative to the rack frame 18. The shelf 40 is mounted directly to the mounting rails 52. The movable tray 38 is mounted to the mounting rails 52 by slide rails 56. The slide rails 56 are provided by either ball bearing or friction type slide rails. Two handles 58 and two latches 60 are mounted on opposite sides of a forward end of the tray 38 of the drawer 20. In some embodiments, the mounting rails 52 which attach directly to the rack frame 18 are provided by the outer rails of the slide rails 56.

Figure 4:
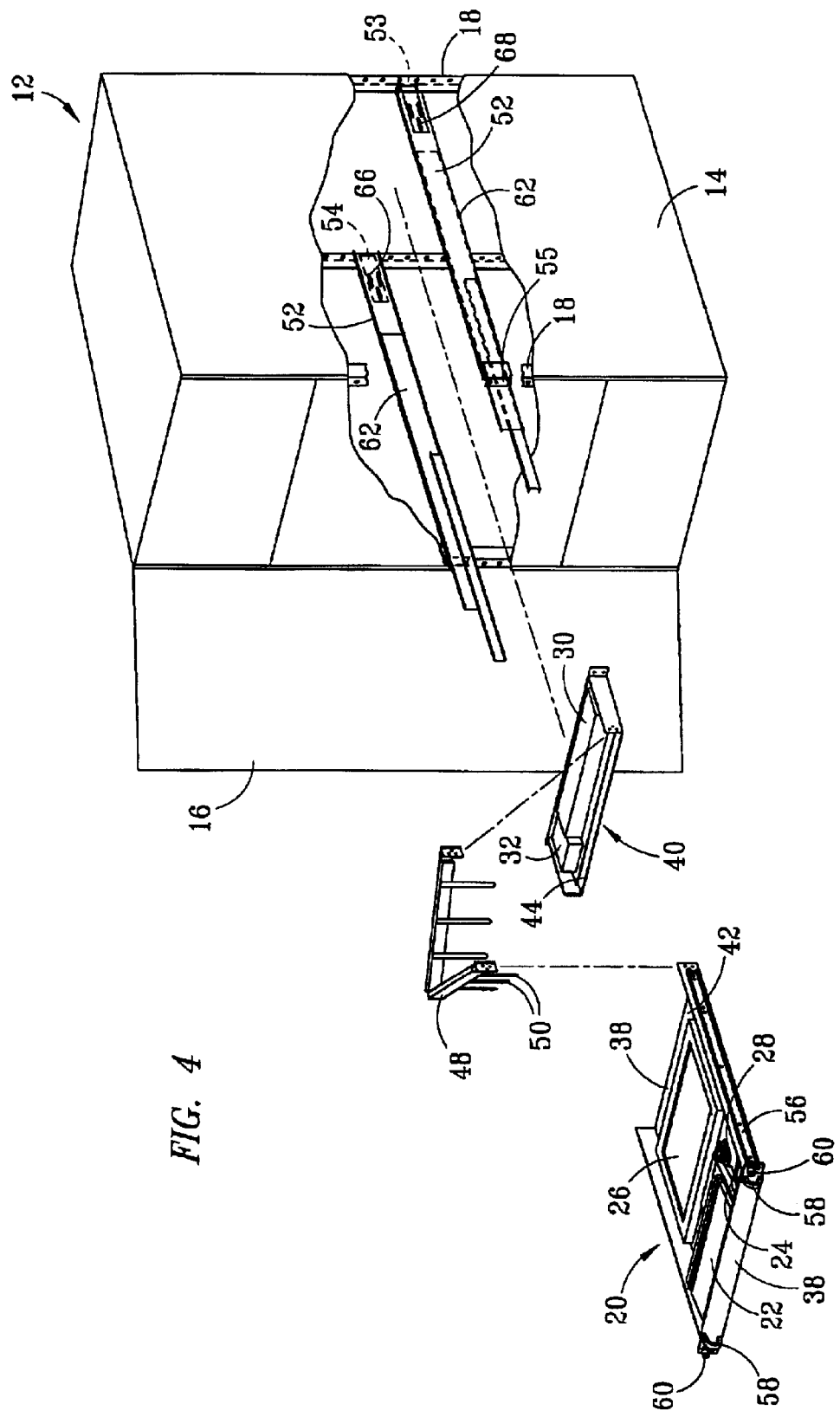
FIG. 4 is an exploded, cutaway view of the server system rack of FIG. 1, showing various components of the drawer in perspective.

FIG. 4 is an exploded view of the server system rack 12, shown in perspective. The mounting rails 52 each have a rail 62, and include the mounting brackets 53, 54, 55 and 57. The rail 62 has a plurality of slots 66 for slidably receiving the fasteners 68, which extend through the mounting brackets 53 and 54. The mounting brackets 53 and 54 include toolless fasteners for securing directly to the rack frame 18. The mounting brackets 55 and 57 (shown in FIG. 3) are disposed on opposite ends of respective ones of the mounting brackets 53 and 53 for securing opposite ends of the mounting rails 52 to the rack frame 18. The electronic switch 30 and the power supply 32 are mounted to the shelf 40. In some embodiments, the power supply 32 may be mounted to the moveable tray 38. The cable management arm 48 connects between the shelf 30 and the tray 38. The flat panel display 26, the keyboard 22 and the pointing device 24 are mounted to the tray 38. The inner rails of the slide rail 56 are directly mounted to the tray 38.

Figure 5:
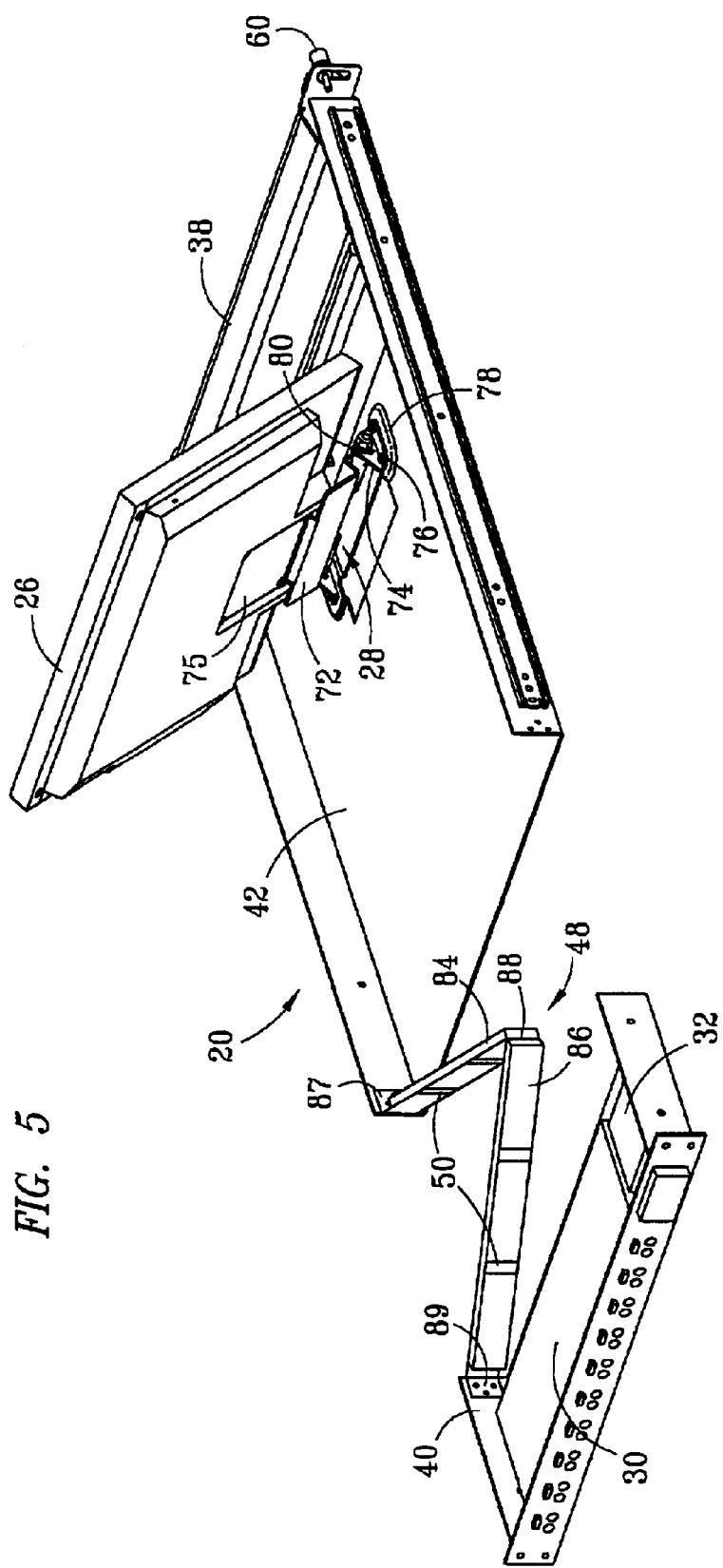
FIG. 5 is a rearward, perspective view of the drawer for the server system rack.

FIG. 5 is a rearward, perspective view of the drawer 20. The flat panel display 26 is pivotally mounted to the tray 38 by the pivot mounting bracket 28. The pivot mounting bracket 28 includes two mounting brackets 74 which mount to opposite sides of the display 26 and directly to the footing provided by the raised mounting surfaces 78 of the bottom 42 of the tray 38. The flat panel display 26 is mounted to a backplate 72 of the pivot mounting bracket 28. The cable arm 48 may be provided by a conventional cable management arm having a linkage 84 which is pivotally connected to a linkage 86 by a hinge 88. Opposite ends of the cable arm 48 have brackets 87 and 89 for securing the linkages 84 and 86 to the rearward end of the tray 38 and the forward end of the shelf 40, respectively. The straps 50 are provided for securing the cable, set 34 (shown in FIG. 1) to the linkages 84 and 86.

Figure 6:
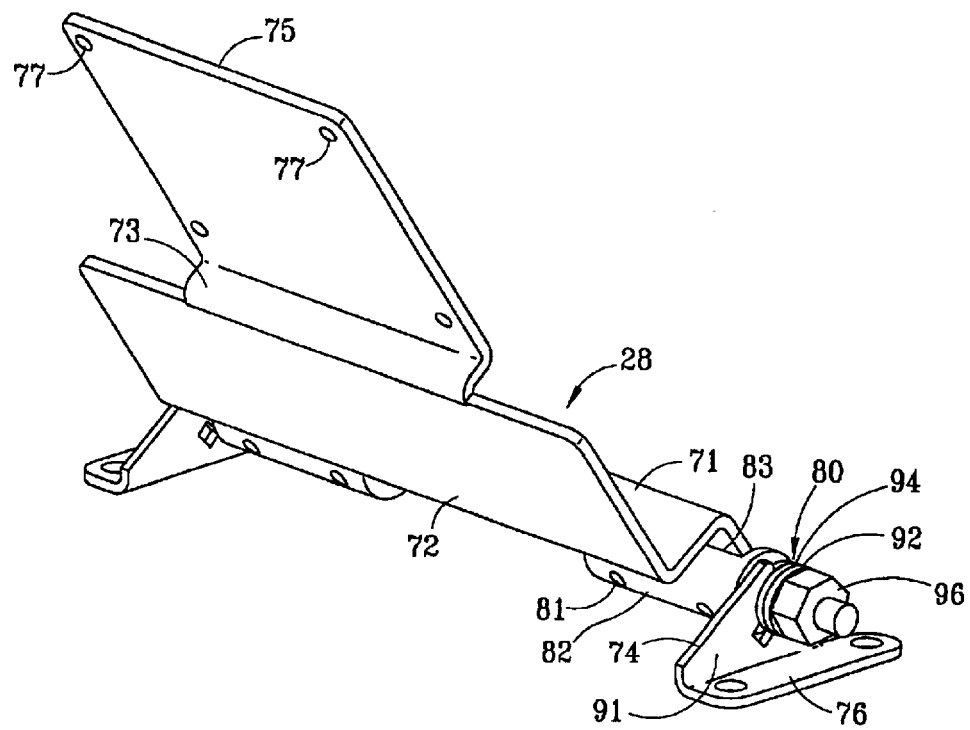
FIG. 6 is a perspective view of a mounting bracket for pivotally mounting the flat panel display to the drawer of the server system rack.

FIG. 6 is a perspective view of the pivot mounting bracket 28. Opposite ends of the backplate 72 are pivotally connected to the mounting brackets 74 by the clutch assemblies 80. The clutch assembles 80 include backplate brackets 82, to which the backplate 72 is secured with fasteners 81. The backplate brackets 82 each have a planar surface 83 to which a flat, or planar, portion of the backplate 72 is secured, flush with the planar surface 83. A lower portion of the backplate 72 is formed to have a Z-shaped cross-section, defining a shoulder 71 which faces in a generally upwards direction when the backplate 72 is disposed in an upright position relative to the horizontally extending, moveable tray 38. An offset section 73 extends outward from the backplate 72, spaced apart from the shoulder 71 and substantially parallel to the shoulder 71, to provide an offset for an upper, planar mounting portion 75 of the backplate 72. The shoulder 71 and the offset section 73 extend perpendicular to the main body of the backplate 72. The upper, planar mounting portion 75 of the backplate 72 is coplanar with the lowermost portion of the backplate 72 which mounts to the planar surfaces 83 of the clutch assemblies 80. Four mounting holes 77 are provided in the portion 75. The pivot mounting bracket 28 further includes two mounting brackets 74 having mounting feet 76. The mounting feet 76 are mounted with fasteners to the footing 78 (shown in FIG. 5).

Figure 7A:
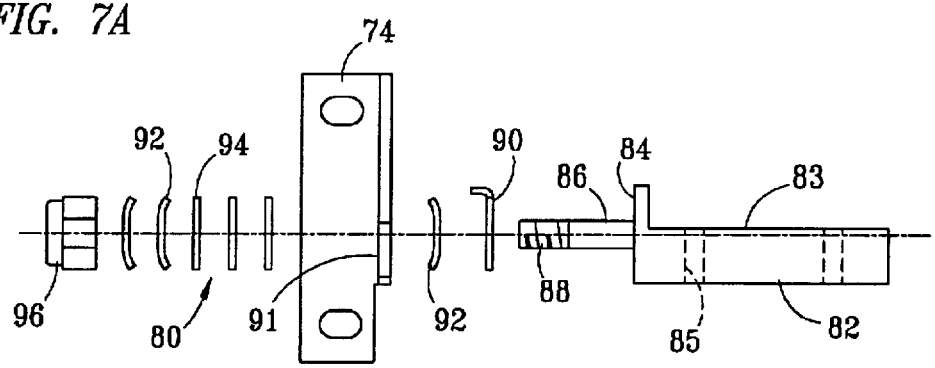
FIGS. 7A and 7B are exploded views of clutch assemblies for pivotally mounting the flat panel display to the drawer of the server system rack.
Figure 7B:
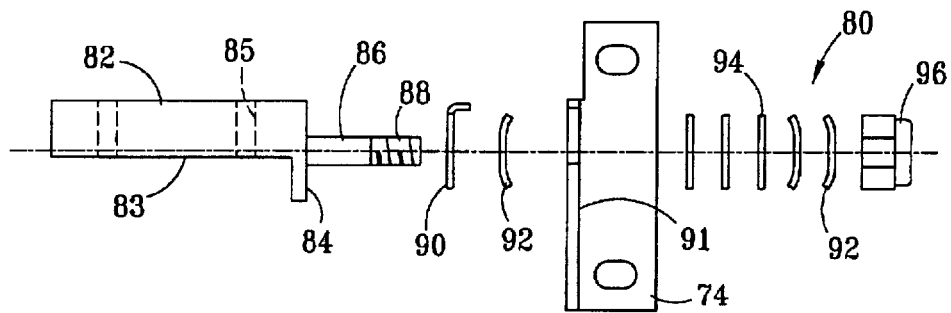

FIGS. 7A and 7B are exploded views of the clutch assemblies 80, looking downward on the two mounting brackets 74. Two backplate brackets 82 each have a planar mounting surface 83, apertures 85 for receiving the fasteners 81(shown in FIG. 6), a planar shoulder 84 and a shank 86. The planar mounting surfaces 83 extend parallel to respective longitudinal axes of the clutch assemblies 80, and the planar shoulders 84 extend perpendicular to the mounting surface 83 and the respective longitudinal axes of the clutch assemblies 80. The shanks 86 of the backplate brackets 82 each have threaded ends 88. A bracket washer 90 has a flat portion which mounts directly against the shoulder 84, and an outward end which extends at a right angle to the flat portion and engages the top of a respective one of the two brackets 74 to provide a stop means. Belleville-type washers 92 and flat washers 94 are secured between threaded nuts 96 and respective ones of the two mounting brackets 74 to provide a spring force which presses innermost ones of the flat washers 94 against the upwardly extending, planar surfaces 91 of respective ones of the two brackets 74 to provide a frictional engagement for retaining the backplate 72 and the flat panel display 26 in an upright position relative to the tray 38. The belleville-type washers 92 and the flat washers 94 thus together provide frictional engagement members, or retaining members, of a frictional engagement means for retaining the backplate 72 in a selected angular position relative to the tray 38.

Figure 8:
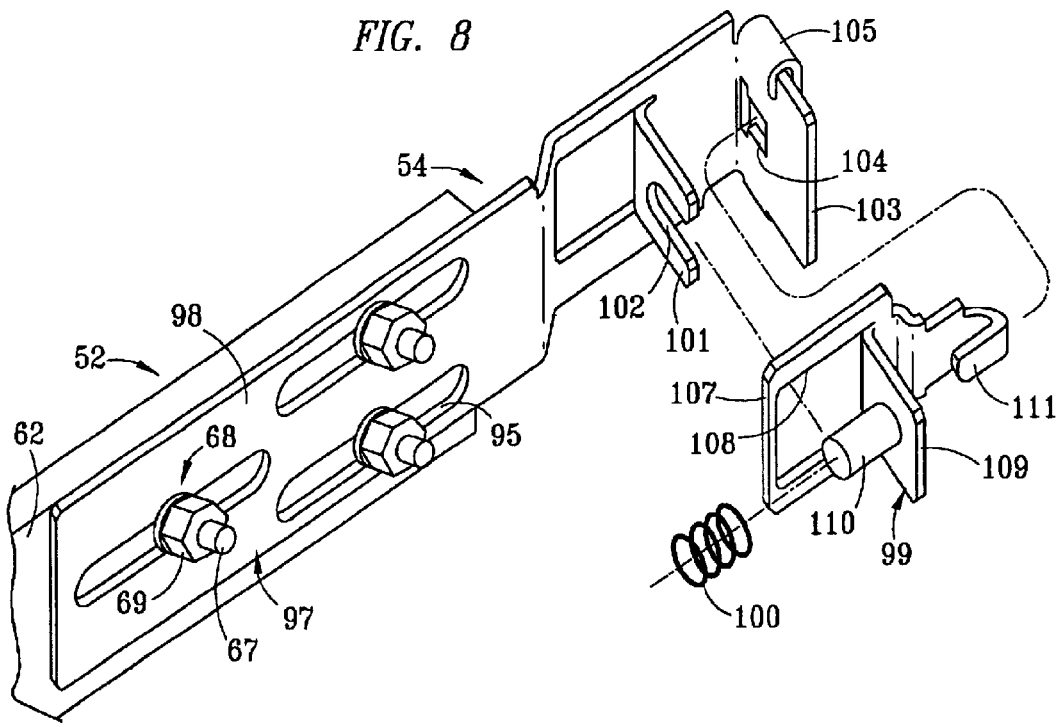
FIGS. 8 through 11 are various views of a left-hand mounting bracket having a toolless fastening and release latch for securing one end of a mounting rail to a frame of the server system rack.
Figure 9:
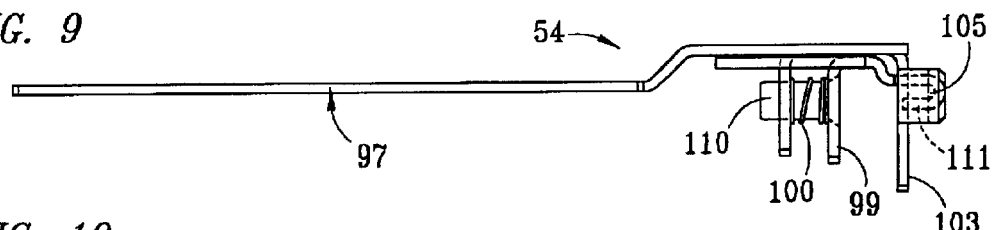
Figure 10:
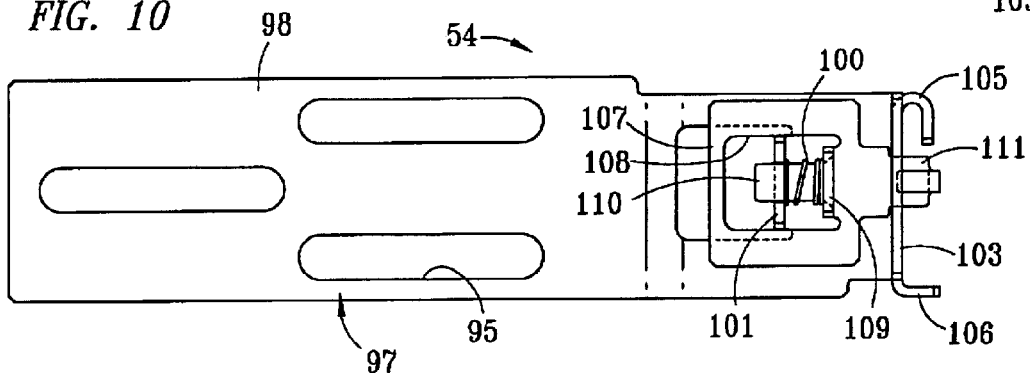
Figure 11:
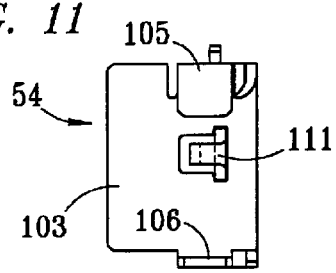

FIGS. 8 through 11 are various views of the left-hand mounting bracket 54, with FIG. 8 showing a partial view of the rail 62 of the mounting rail 52. The left-hand bracket 54 provides a toolless mounting fastener having a lineally sliding latch member 99, which is guided to move in lineal-directions relative to the mounting rails 52, rather than in arcuate or angular directions. The left-hand mounting bracket 54 includes a slide bracket 97 having an elongated body 98 in which three slots 95 are formed. The three slots 95 extend parallel to a longitudinal length of the elongated body 98 of the slide bracket 97, and are configured for aligning with the slots 66 (shown in FIG. 4) in one of the mounting rails 52. Fasteners 68 extend between the slots 95 in the elongated body 98 and the slots 66 in the mounting rail 52 for slidably securing the mounting bracket 54 to the mounting rail 52, such that the combined length of the mounting rail 52 and the mounting bracket 54 is self-adjusting when being mounted to the rack frame 18. The mounting bracket 54 includes the latch member 99 which is slidably secured to the slide bracket 97 and biased into an extended, or latched, position by a spring 100 to secure the mounting bracket 54 to the rack frame 18. The latch member 99 is moveable between the latched position and a released position for selectively fastening the mounting bracket 54 to the rack frame 18 and releasing the mounting bracket 54 from the rack frame 18 without the use of tooling.

The slide bracket 97 includes a tab 10 which extends transverse to a planar surface and the longitudinal length of the elongated body 98. A slot 102 is formed into the side of the tab 101, extending from an edge of the tab 101 which is opposite the side of the tab adjacent to the elongated body 98, and extending inwards toward the elongated body 98, in a direction which is transverse to the length of the elongated body 98. A second tab 103 extends on a terminal end of the bracket 97, transverse to the elongated body 98 and parallel to the first tab 101. The second tab 103 is spaced apart from the first tab 101. The second tab 103 has an aperture 104 which is aligned with an inward portion of the slot 102 of the tab 101. A clip member 105 is provided by a protuberant member which extends from the upward end of the tab 103. The clip member 105 has an inner portion which extends transverse to a planar surface of the second tab 103, and has an outer portion which extends in a downward direction, parallel to the planar surface of the second tab 103, to provide a latch member for latching the second tab 103 to the rack frame 18. On the bottom portion of the tab 103 is a tang, or tab member, 106 provided by a protuberant member which extends in an outward direction, transverse to the planar surface of the second tab 103, and parallel to the direction of the length of the elongated body 98 and the rail 62 of the mounting rail 52. The clip member 105 and the tab member 106 are aligned and spaced apart for fitting within two of the apertures 19 of the rack frame 18 (shown in FIG. 1), with the aperture 104 aligned with one of the apertures 19 which is disposed between the two of the apertures 19 in which respective ones of the clip member 105 and tab member 106 are disposed.

The latch member 99 includes a guide portion 107 defined by a flat plate member having a guide aperture 108 extending therethrough. The guide portion 107 includes a planar surface for slidably fitting alongside a planar portion of the elongated body 98 in a sliding engagement. The guide aperture 108 is disposed in the planar surface of the guide portion 107 and is sized for receiving the tab 101 in a sliding arrangement The latch member 99 further includes a flange 109 which extends transverse to the planar surface that provides the guide portion 107. The flange member 109 has a post 110 which extends transverse to a flat, or planar, surface of the flange 109. The post 110 extends parallel to the planar surface of the guide portion 107 and the guide aperture 108. The post 110 is slidably received within the slot 102 of the first tab 101. The latch member 99 further includes a latch tab 111 which is provided by a protuberant tab which extends forward of the flange 109 for being received within the aperture 104 of the second tab 103. The latch tab 111 movably extends through the aperture 104 in the second tab 103 for extending into one of the apertures 19 in the rack frame 18. The latch tab 111 is formed from a forwardly extending tang of metal which has a height which is slightly smaller than the height of the apertures 19, and which is formed to have a bend of approximately one-hundred and eighty degrees, such that opposite sides of the tang are spaced apart to define a width of approximately the width of the apertures 19. The clip member 105 and the tab member 106 also have widths which are slightly smaller than the width of the apertures 19 of the rack frame 18. The guide portion 107, the flange member 109 and the latch tab 111 of the latch member 99 are formed of a single member and disposed in fixed relation to one another. The post 110 is fixedly secured to the flange 109.

The latch member 99 is slidably coupled to the bracket 97, with the tab 101 slidably extending within the guide aperture 108, the post 110 slidably extending within the slot 102, and the latch tab 111 slidably extending through the aperture 104. The spring 100 is disposed around the post 110 and exerts a biasing force between the flange 109 and the tab 101, such that the latch tab 111 is urged to move outward of and through the hole 104 to extend outward of the second tab 103. A user may push the flange 109 lineally rearward, along a straight line, toward the first tab 101 and against the force of the spring 100, which urges the latch tab 111 to retract back into the aperture 104. The clip member 105 may then be inserted through one of the regularly spaced apertures 19 of the rack frame 18, with the tab member 106 also being simultaneously inserted into an upper portion of another of the apertures 19 of the rack frame 18, which is spaced apart from the one of the apertures 19 which receives the clip member 105. As the clip member 105 and the tab member 106 are inserted in the respective apertures 19, the elongated body 98 of the mounting bracket 54 is free to slidably move relative to the rail 62 of the mounting rail 52, such that the overall, combined length of the mounting rail 52 and the mounting bracket 54 may be automatically adjusted by movement of the mounting bracket 54 relative to the mounting rail 52. The mounting bracket 54 will then be moved lineally downward, along a straight line, to move the clip member 105 and the tab member 106 downward within the respective ones of the apertures 19 of the rack frame 18, such that the outer portion of the clip member 105 will latch to the web of the rack frame 18 disposed between two adjacent ones of the apertures 19, latching the second tab 103 and the mounting bracket 54 to the rack 12. The flange 109 may then be released to allow the spring 100 to urge the flange 109 to move lineally, along a straight line, towards the second tab 103, urging the latch tab 111 to lineally pass through the aperture 104 and into one of the apertures 19 of the rack frame 18 to prevent the clip member 105 and the tab member 106 from moving upward within the respective apertures 16, and latching the mounting bracket 54 in a fixed, stationary position relative to the rack 12. The width and the height of the latch tab 111 are the same approximate size as the apertures 19 in the rack frame 18, providing greater strength for the mounting bracket 54 as compared to prior art mounting brackets which have smaller insertion tabs that are significantly smaller than the same, approximate size of the apertures 19, such as those which are fifty to twenty percent the size of rack frame apertures to provide clearance when inserted by angular movement of prior art latch members into the rack frame apertures, rather than lineal movement.

The mounting bracket 54 may be released in a similar fashion. The flange 109 of the latch member 99 is first moved lineally toward the first tab 101 to urge the latch member 99 rearward, compressing the spring 100 between the flange 109 and the first tab 101 until the latch tab 111 is retracted from extending within one of the apertures 19 of the rack frame. Once the latch tab 111 is retracted from extending within one of the apertures 19, the mounting bracket 54 may be moved lineally upwards to remove the outer portion of the clip member 105 from being adjacent to the web of the rack frame 18 disposed between two adjacent ones of the apertures 19 and being in a position in which the outer portion of the clip member 105 is aligned for passing through the respective one of the apertures 19 of the rack frame 18. The tab 106 is simultaneously moved upwards within the respective aperture 19, and into a top region of the respective aperture 19. The clip 105 and the tab 106 may then be removed from within the apertures of the rack frame 19. Preferably, the mounting bracket 54 remains slidably secured to the mounting rail 62, free to move in a lineal direction by the fasteners 68 slidably engaging in the slots 66 and 99, such that the overall, combined length of the mounting bracket 54 and the rail 62 are self-adjusting.

Figure 12:
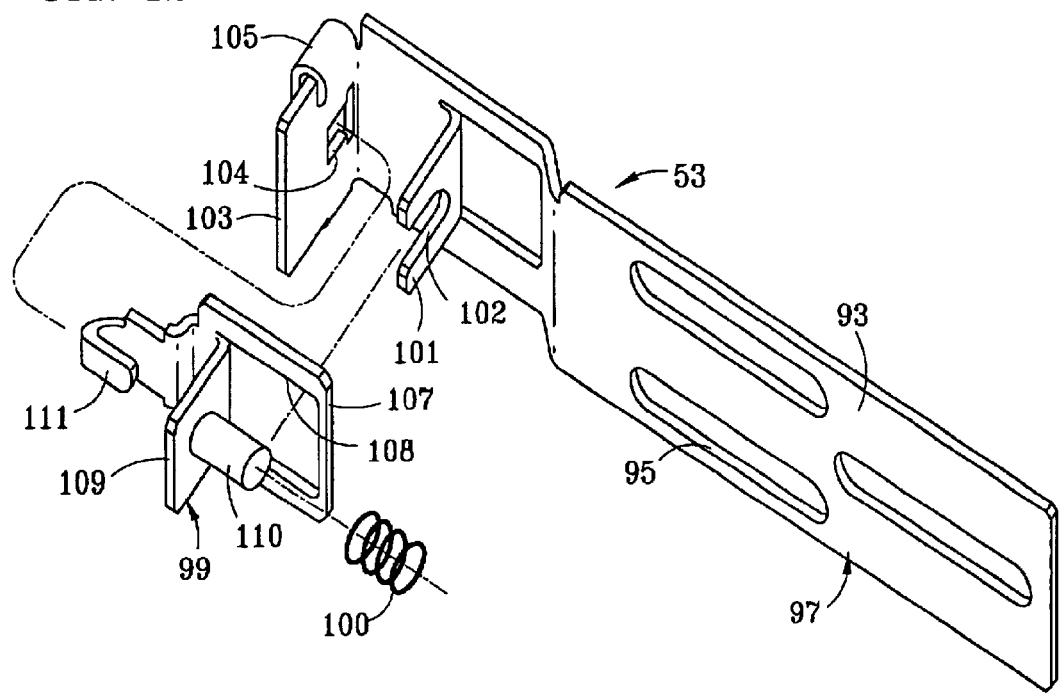
FIG. 12 is an exploded view of a right-hand mounting bracket having a toolless fastening and release latch for securing one end of a mounting rail to the frame of the server system rack.

FIG. 12 is an exploded view of a right-hand toolless mounting bracket 53, which is symmetrical to the mounting bracket 54. The mounting bracket 53 has the same components as the mounting bracket 54, except that the mounting bracket 53 is a mirror image of the mounting bracket 54. The elongated body 93 of the mounting bracket 53 is formed in an oppositely formed shape than that of the elongated body 98 of the mounting bracket 53, being formed in what is herein defined as a right-hand orientation, for mounting on the rearward end of the one of the mounting rails 62 that is mounted on the right-band side of the rack frame 18. It should also be noted that the right-hand mounting bracket 53 may also be mounted to the forward end of the one of the mounting rails 62 which is mounted to the left-hand side of the rack frame 18. Similarly, the mounting bracket 54 may be mounted to either the rearward end of the mounting rail 62 mounted to the left-side of the rack frame 18, or the forward end of mounting rail 62 mounted to the right-side of the rack frame 18. The mounting bracket 53 includes the latch member 99, the tab 101, the slot 102, the tab 103, the aperture 104, the clip member 105 and the tab member 106. The tab 101 is slidably received in the guide aperture 108, with the post 110 extending within the slot 102 of the tab 101. The latch tab 111 will extend through the aperture 104 of the tab 103 for fitting within the one of the apertures 19 of the rack frame 18, such that the latch member 99, in combination with the tab 101 and 103, provide a toolless mounting fastener.

Figure 13:
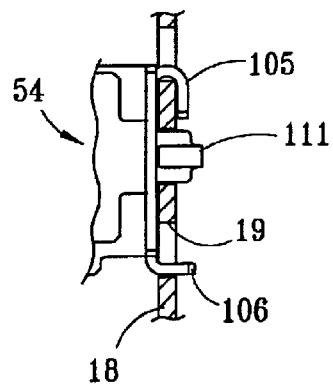
FIG. 13 is a partial, cutaway view of a rack frame with a left-hand mounting bracket secured to the rack frame.

FIG. 13 is a sectional view of the right-hand mounting bracket 54 secured to the rack frame 18. The clip member 105 and the tab member 106 have been inserted into two spaced apart mounting apertures 19 of the rack frame 18. The latch tab 111 has been released to insert into one of the mounting apertures which is intermediate one of the two spaced apart mounting apertures 19 in which the clip member 105 and the tab member 106 are inserted. Releasing the latch tab 111 into one of the apertures 19, with the clip member 105 and the tab member 106 disposed within two of the apertures 19, latches the mounting bracket 54 to the rack frame 18.

Figure 14:
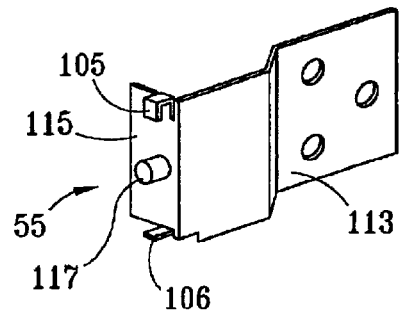
FIG. 14 is a perspective view of an alternative left-hand mounting bracket for securing one end of the mounting rails to the frame of the server system rack.

FIG. 14 is a perspective view of a left-hand mounting bracket 55 for securing one of the self adjusting mounting rails 52 to the forward, right-hand side of the rack frame 18. A right-hand bracket 57 (shown in FIG. 3) is also provided that is identical to the bracket 55, having the same structure, but formed for securing one of the mounting rails to the forward, left-hand side of the rack frame 18. The mounting brackets 55 and 57 (one shown) each have a main body portion 113 having a terminal end face 115. The main body portion 113 secures to the rail 62 (shown in FIG. 4) and extends along the length of the mounting rail 62 (shown in FIG. 4). In some embodiments, the main body portion 113 is provided by the rail 62, such that the portion 113 is integrally formed with the rail 62 (shown in FIG. 4). The end face 115 is a planar surface which extends transverse to, preferably perpendicular to, the length of the mounting rail 62. A clip member 105 and a tab member 106 extend from the terminal end face 115. The clip member 105 is provided by a protuberant member which extends from the upward end of the end face 115. A post 117 is fixedly secured to the end face 115, and has a length and a width which are approximately the same size as the apertures 19.

The clip member 105 has an inner portion which extends transverse to the planar surface of the end face 115, and has an outer portion which extends in a downward direction, parallel to the planar surface of the end face 115 to provide a latch member for latching respective ones of the mounting brackets 55 and 57 to the rack frame 18. A tang 106, or tab member, is provided by a protuberant member which extends in an outward direction from the planar surface of the end face 115, and parallel to the direction of the length of the elongated body 113 and respective ones of the rails 62 of the mounting rails 52. The clip member 105 and the tab member 106 are aligned and spaced apart for fitting within two of the apertures 19 of the rack frame 18 (shown in FIG. 1), similar to that described above for the mounting brackets 53 and 54, except that the post 117 is fixedly mounted to the end face 115, such that the post 117 will not move relative to the end face 15. In other embodiments, the mounting brackets 53 and 54 may be used on opposite ends of the mounting rails 52 in place of the mounting brackets 55 and 57, such that the latch members 99 will latch all four ends of the mounting rails 62 to the rack frame 18. The elongated members 98 of the mounting brackets 53 and 54 may also be provided by the rails 62, such that the brackets 53 and 54 are integrally formed with the rails 62.

Figure 15:
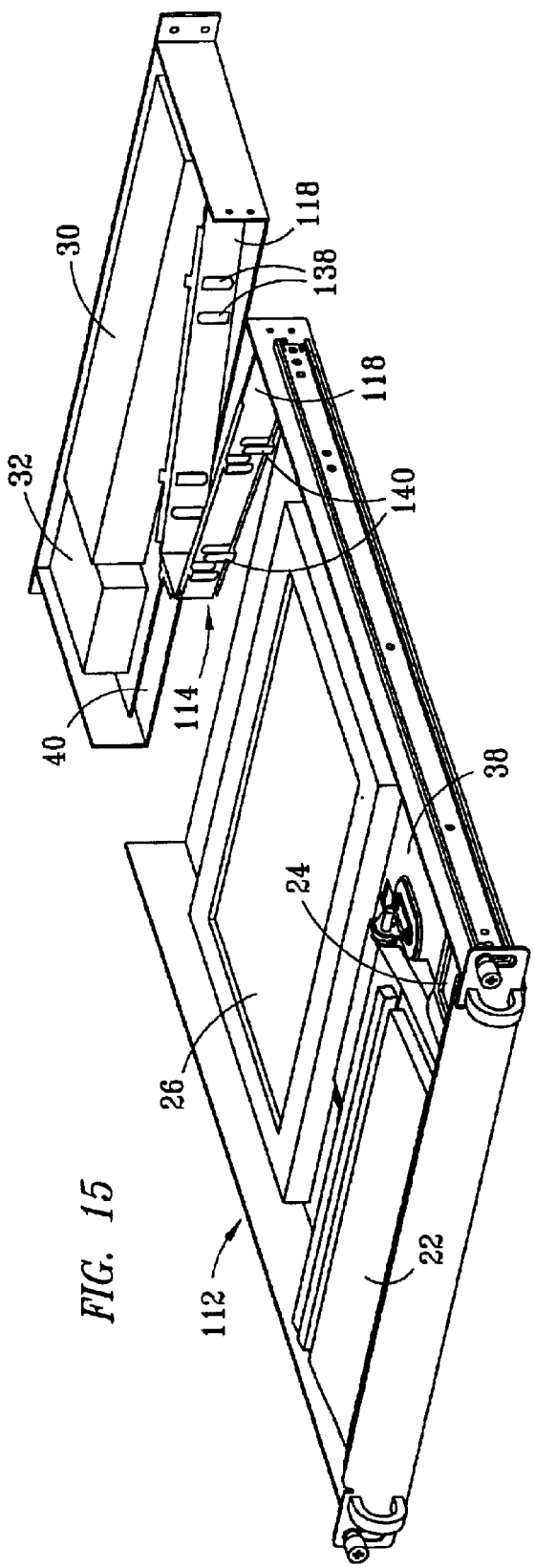
FIG. 15 is a perspective view of an alternative drawer for a server system rack.

FIG. 15 is a perspective view of an alternative drawer 112 having a movable tray 38 and a stationary shelf 40 with an alternative cable management arm 114 connecting between the tray 38 and the shelf 40. The alternative drawer 112 includes the keyboard 22, the pointing device 24, the flat panel display 26, the electronic switch 30 and the power supply 32. The cable management arm 114 is provided by a flexible, singular member formed of molded plastic with mounting ends 118, which mount to the moveable tray 38 and the stationary shelf 40, respectively. The cable management arm has apertures 138 and molded cable retention tabs 140, which are disposed adjacent the apertures 138. The shelf 40 is a stationary mount which provides a stationary mounting means for securing the electronic switch 30 in fixed relation to the mounting rails 52. The power supply 32 may be mounted to either the shelf 40, as shown, or to the moveable tray 38. FIG. 16 is a perspective view of the one-piece, cable management arm 114 which is formed of a single molded member 116, formed of a plastic, such as polypropylene. The member 116 has a cross-section of a channel shape, with a planar, main body portion 445 and opposite edges 142 defining sides that are perpendicular to the planar, main body portion 145 to define reinforcing flanges. The cable management arm 114 has opposite mounting ends 118. Integrally molded hinges 120 are formed into various portions of the single member 116, with lengths that extend transverse to a longitudinal axis 122 of the member 116. The hinges 120 define respective ends of separate linkages 124, 126 and 128, and the end mounting tabs 130 and 134, of the single member 116 providing the cable management arm 114. Mounting apertures 136 are provided in the tabs 130 and 134 for receiving fasteners to secure the respective ends 118 to the tray 38 and the shelf 40, or directly to the electronic switch 30. Aperture 138 are formed into the member 116, being spaced apart along the longitudinal axis 122. Adjacent to each of the apertures 138 are cable retention tabs 140, which are molded, L-shaped portions of the member 116 which are spaced apart from a planar surface 145 of the member 116. The cable retention tabs 140 provide molded plastic cable retention means for securing a cable set 34 (shown in phantom in FIG. 1) which connects the electronic switch 30 and the power supply 32 to the keyboard 22, the display 26 and the pointing device 24 of the tray 38. Adjacent ones of the molded retention tabs 140 have first portions 143 which alternatively extend from the opposite edges 142 of the member 116, transverse to the main, planar surface 145 of the member 116. The retention tabs 140 have second portions 144 which extend transverse to the first portions 143 of the tabs 140, and parallel to the main surface 145 of the member 116, spaced apart from the surface 145. Adjacent ones of the first portions 143 of the tabs 140 extend from alternate ones of the opposite edges 142 of the member 116.

FIG. 17 is a partial, section view across a hinge region defined by one of the molded hinges 120 of the single molded member 116 providing the cable management arm 114, taken along section line 17—17 of FIG. 16. Two notches, or indentations, 121 and 123 extend into opposite sides of the singular member 116, extending across the width of the singular member 116, and perpendicular to the longitudinal axis 122 (shown in FIG. 16). Two grooves are defined by the two notches 121 and 123 which are oppositely disposed, in a back-to-back alignment on opposite side of the hinge region of the hinge 120. The two notches 121 and 123 are each respectively symmetrical about a central plane 125 of the hinge 120. The notch 123 is concave and provides a surface with a generally arcuate, or rounded, shape. The notch 121 is concave and has a generally rectangular shape. The outward edges of the notches 121 and 123 are chamferred, to allow the molded hinge 120 to bend around the plane 125 to a ninety degree angle. Preferably, the hinges 120 between the linkages 124, 126 and 128 bend such that the opposite edges of the notch 123 move closer together and the outward edges of the notch 121 move further apart in bending about the plane 125. The hinges 120 between the tabs 130 and 134 and the linkages 124 and 128 are mounted to the stationary electronic switch 30 and the moveable tray 38 such that the outward edges of the notch 121 move closer together in bending about the plane 125.

FIG. 18 is a rearward, perspective view of an alternative electronic switch 154 for an alternative drawer 152. The switch 154 is housed within an enclosure 156 which is secured to the shelf 40. A power supply 158 is also secured to the shelf 40. A plurality of cable sets 162 (one shown) are provided for directly connecting the electronic switch 154 to various servers used with the server system rack 12. One of the cable sets 162 is used for connecting the electronic switch 154 to the keyboard 22, the pointing device 24 and the flat panel display 26 to the electronic switch 154. The cable set 162 has a first end with three separate connectors 164, 166 and 168 for securing directly to the keyboard, pointing device and monitor jacks, respectively, of one of the associated servers. The second end of the cable set 162 includes a connector 144 which secures directly to the single connector 146 on the face of the electronic switch 154, and connects all three of the separate connectors 164, 166 and 168 to the electronic switch 154. The cable set 162 could also include a power cable for the display 26, or a separate power cable may be used. In some embodiments, the power supply 158 may be mounted to the moveable tray 38, and then a power cable is provided for running from the rack frame 18, along a cable management arm 114, and to the moveable tray 38.

FIG. 19 is a rearward view of an alternative drawer 170 having the keyboard 22, the pointing device 24 and the display 26 which are mounted to the moveable tray 38, and an alternative electronic switch 172 and a power supply 174 which are fixedly mounted to the mounting rails 176 for mounting to the rack frame 18. In some embodiments, the power supply 174 may be mounted to the moveable tray 38. Mounting rails 176 secure the drawer to the rack frame 18. The mounting brackets 53 and 54 are mounted to terminal ends of respective ones of the mounting rails 176, such that the total, combined length of the mounting rails 176 and respective ones of the mounting brackets 53 and 54 are self-adjusting to accommodate different sizes of depths of the rack frames 18. The mounting brackets 55 and 57 are mounted to respective ones of the forward ends of the mounting rails 176. The electronic switch 172 and the power supply 174 may be mounted directly to the mounting rails 176, without a stationary shelf 40. Preferably, the electronic switch 172 and the power supply 174 are fixedly secured together along the interface 180 between the electronic switch 172 and the power supply 174 by means of a bracket 184. In other embodiments, the electronic switch 172 and the power supply may be secured together with adhesives, fasteners, or a plate which extends along the edges of the undersides of the electronic switch 172 and the power supply 174. Spacer brackets 178 are stationary mounts which provide stationary mounting means for fixedly securing the electronic switch 172 and the power supply 174 directly to mounting rails 176, in fixed relation to the rails 176. Preferably, the spacer brackets 178 are integrally formed as part of the mounting rails 176, similar to the bracket 218 having the J-slots 220 of FIG. 21. In some embodiments, only one of the spacer brackets 178 may be required. The electronic switch 172 and the power supply 174 may also be mounted directly to the mounting rails 176 if the housings of the switch 172 and power supply 174 have widths which are of a size to provide stationary mounting means for securing directly to the mounting rails 176.

FIG. 20 is a perspective view of the mounting bracket 184 for securing the electronic switch 172 and the power supply 174 of FIG. 19 to the mounting rails 176. The mounting bracket 184 is formed from a singular sheet 186 of material, such as a sheet metal. The sheet 186 is formed to have a sidewall 188, which is secured directly to the electronic switch 172, with fasteners being secured through the mounting holes 200 in the sidewall 188. A lower mounting surface 190 is formed, and may provide a mounting surface for mounting the power supply 174, provided the power supply 174 is not alternatively mounted to the moveable tray 38. An intermediate portion of the sheet 186 provides an intermediate sidewall 192. A second bracket potion 194 includes a sidewall 196. Two lugs 198 are mounted to the second sidewall 196 for securing in J-slots formed in the brackets 178 of the mounting rails 176, similar to the J-slots 220 formed into the brackets 218 of FIG. 20. The mounting bracket 184 (shown in FIG. 20) is used to secure one side of an electronic switch 172 to one of the mounting rails 176. The side of the electronic switch 172, which is opposite to the side which is mounted to the mounting bracket 184, may have lugs 198 mounted thereto for securing into the bracket 178 of the mounting rail 176 mounted to the right side of the drawer.

Figure 21:
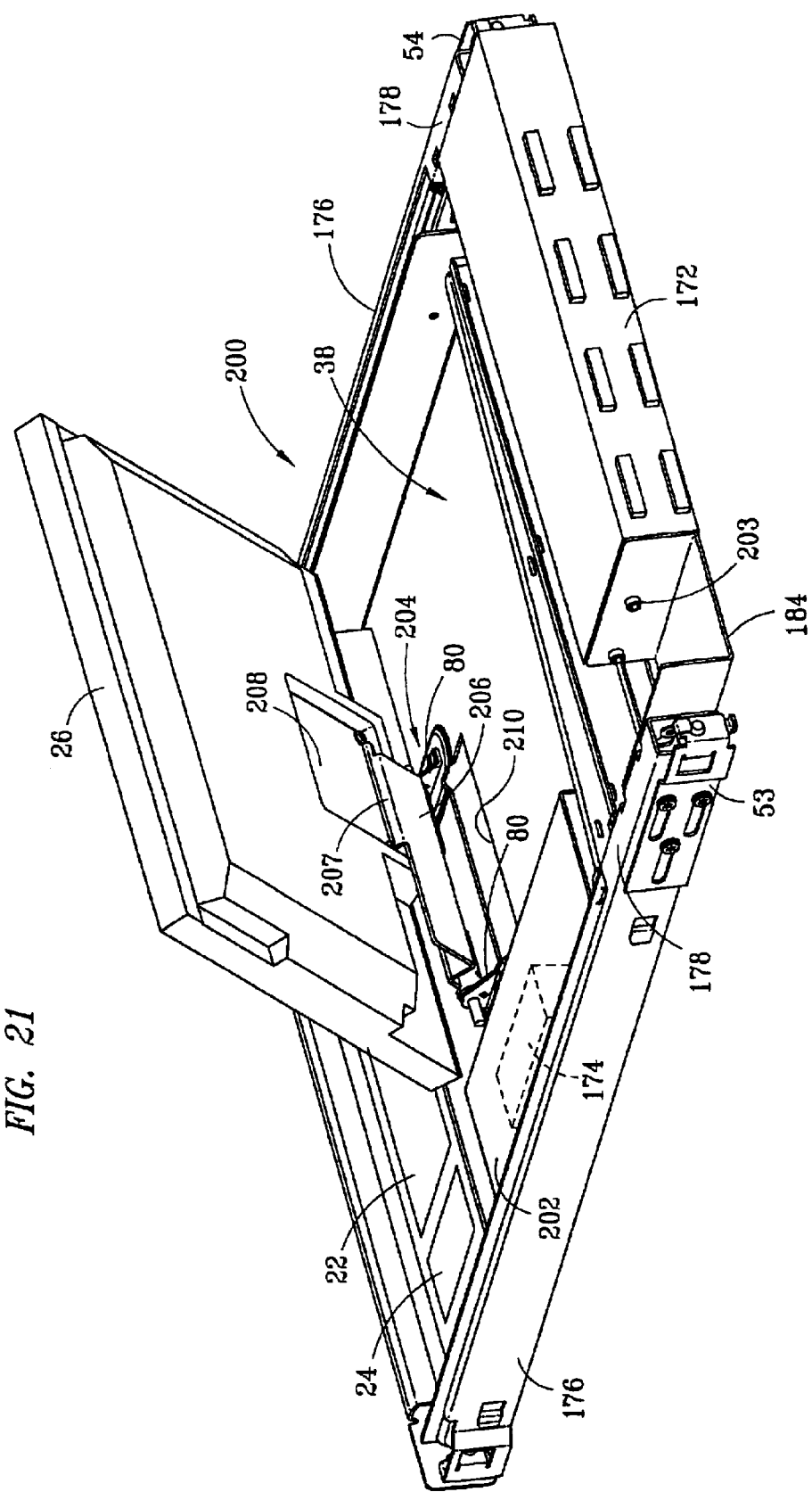
FIG. 21 is a perspective view of a mounting bracket for an electronic switch.

FIG. 21 is a rearward view of an alternative drawer 200 having the keyboard 22, the pointing device 24 and the display 26 which are mounted to the moveable tray 38 to provide interface devices. The power supply 174 (shown in hidden lines) is mounted to the moveable tray 38, and a sheet metal enclosure 202 is secured to the moveable tray 38 such that the enclosure 202 covers the power supply 174. The display 26 is mounted to the moveable tray 38 with an alternative pivot mounting bracket 204. The pivot mounting bracket 204 is similar to the pivot mounting bracket 28 (shown in FIG. 6), and includes the clutch assemblies 80 for pivotally securing a backplate 206 to the moveable tray 38. The backplate 206 includes an offset section 207 and a planar mounting portion 208. The backplate 206 is similar to the backplate 72 of FIG. 6, except that the planar mounting portion 208 is offset relative to the center of the main body portion of the backplate 206, rather than being centered, such that the display 26 will be mounted to one side of the moveable tray 38. This provides space for mounting the power supply 174 and the enclosure 202 to the moveable tray 38, disposed to one side of the display 26. A hole 210 is provided in the tray 38 for receiving a portion of the backplate 206.

The alternative electronic switch 172 is fixedly mounted to the mounting rails 176, rearward of the moveable tray 38. The mounting rails 176 secure the drawer 200 to the rack frame 18. The mounting brackets 53 and 54 are mounted to terminal ends of respective ones of the mounting rails 176, such that the total, combined length of the mounting rails 176 and respective ones of the mounting brackets 53 and 54 are self-adjusting to accommodate various ones of the rack frames 18 having various depths. One side of the electronic switch 172 is fixedly mounted directly to the left-side one of the brackets 178 of the mounting rails 176. The other side of the electronic switch 172 is fixedly mounted directly to the U-shaped mounting bracket 184. The mounting bracket 184 is the same as that shown in FIGS. 19 and 20, except that the lugs 196 have been moved from the mounting holes in which they are disposed in FIGS. 19 and 20 to the mounting holes 198 (shown in FIG. 20), such that, as viewed from the forward end of the drawer 200, the mounting bracket 184 secures the right side of the electronic switch 172 to the right-side mounting rail 176. The lugs 196 (shown in FIG. 20) secure the right side of the mounting bracket 184 to the right-side spacer bracket 178 of right-side mounting rail 176, fitting in J-slots which are similar to the J-slots 220 (shown in FIG. 22) for the left-side mounting rail 214. Fasteners 203 extend through the holes 198 (shown in FIG. 20) and into an enclosure housing of the power supply 172 to secure the U-shaped mounting bracket 184 to the power supply 172.

FIG. 22 is a perspective view of an alternative left-hand mounting rail 212 having a toolless, mounting brackets 222 and 226, arid tapered plunger latches 278 and 276, respectively. The mounting rail 212 is formed of a rail 214 having a flanged 215 formed on one longitudinal end as a stiffener. Mounting holes 216 are provided for securing to slide rails. In some embodiments, the rails 214 may be provided by rails from a slide rail assembly. A bracket 218 is provided having J-slots 220 for receiving mounting lugs, such as the mounting lugs 198 of FIG. 20. The bracket 218 is formed from the rail 214, as a singular member. A mounting bracket 222 is integrally formed on the forward end of the rail 214 for securing the forward end of the mounting rail 212 to a server rack frame. A mounting bracket 226 secured to a slide bracket 224, which is mounted to the rearward end of the rail 214. The mounting bracket 226 is mounted to the slide bracket 224 such that the mounting rail 212 will be self-adjusting in length when being secured to a server rack frame.

FIG. 23 is a partial, perspective view of the alternative left-hand mounting rail 212, showing an opposite side of the rail 214 from that shown in FIG. 22. The slide bracket 224 includes an elongated strip 270 which is slidably secured to the rail 214. The strip 270 includes three elongated slots 272, with three fasteners 274 fixedly secured in the rail 214 and slidably secured in respective ones of the three slots 272, such that the overall length of the mounting rail 212 is self adjusting for fitting cabinets and rack frames of varying depths. A hole 254 is formed into a rearward portion of the strip 270. The bracket 218 is formed from an edge of the rail 214, and extends on an opposite side of the rail 214 from the elongated strip 270 of the slide bracket 224. The two J slots 220 are provided in the bracket 218. The mounting bracket 226 is mounted to the rearward end of the slide bracket 224.

FIG. 24 is an enlarged, partial perspective view of the rearward end of the mounting rail 212, showing the left-hand mounting bracket 226 having the tapered plunger latch 276. The bracket 218 is shown as being formed by bending an end portion of the rail 214 into a U-shaped channel. The slots 220 are cut into an outer portion of the U-shaped channel providing the bracket 218. The square-shaped hole 254 is formed into the strip 270 of the bracket 224 to provide a mounting tab 256, which extends perpendicular to the longitudinal length of the elongated strip 270. A mounting hole 257 is formed into a central portion of the mounting tab 256. The mounting hole 257 is round, and receives a rearward end of a tapered plunger latch member 252 in a press fit to fixedly secure the rearward end of the latch member 252 to the tab 256 in a cantilevered mounting arrangement. A rearward portion of the strip 270 is formed to provide a tab 258, at a right angle to the main body of the strip 270. A guide hole 264 is formed into the tab 258 for slidably receiving the forward end of the tapered latch member 252. The guide hole 264 is closely sized to the outer diameter of the latch member 252, to provide structural support to the outer end of the plunger latch member 252 since the rearward end of the latch member 252 is mounted to the mounting tab 256 in the cantilevered arrangement. The top and the bottom portions of the tab 258 are formed to provide a clip member 260 and a tab member 262. The tab member 262 extends at a right angle to the rearward face of the tab 258. An initial portion of the clip member 260 extends outward of the rearwardly disposed face of the tab 258, perpendicular to the rearward face of the tab 258. An outer portion of the clip member 260 is formed to extend downward, parallel to the rearwardly disposed face of the tab 258 for securing a web portion of the rack frame between the clip member 260 and the rearward face of the tab 258. The tab 258 will extend through an aperture 19 of the rack frame 18, with the outward end of the latch member 252 extending through one of the apertures 19 of the rack frame which is between two of the apertures 19 through which the clip member 260 extends and the tab member 262 extends, respectively.

Figure 25:
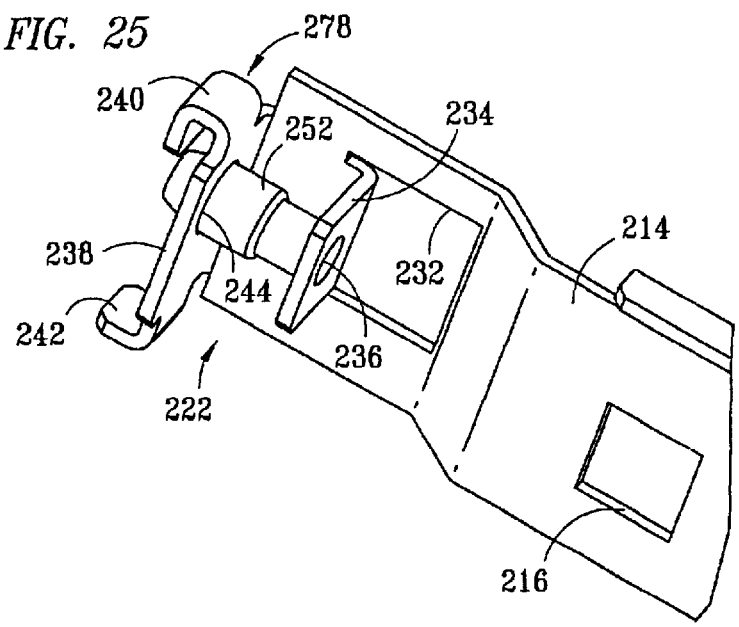
FIG. 25 is a partial perspective view of the alternative mounting rail, showing a forwardly disposed, tapered plunger latch.

FIG. 25 is an enlarged, partial perspective view of the forward end of the mounting rail 212, showing the right-hand toolless mounting bracket 222 having the tapered plunger latch 278. The mounting bracket 222 and the tapered plunger latch 278 are substantially mirror images of the mounting bracket 226 and the tapered plunger latch 276, shown in FIG. 24. The mounting bracket 222 is integrally formed with, directly on the rearward end of the rail 214, rather than providing a separate mounting bracket. A square hole 232 is formed into the rail 214 to provide a mounting tab 234. A mounting hole 236 is formed into the mounting tab 234. The mounting hole 236 is sized for press fitting the rearward end portion one of the latch members 252 into the mounting tab 234, fixedly mounted to the tab 234 in a cantilevered arrangement. The forward, terminal end of the rail 214 is formed at a right angle to the plane of a main body portion of the rail 214 to provide a tab 238. A guide hole 244 is formed into the tab 238 for slidably receiving the forward end of the latch member 252. The guide hole 244 is closely sized to the outer diameter of the tapered plunger latch member 252, to provide structural support to the outer end of the latch member 252 which is mounted to the mounting tab 234 in the cantilevered arrangement. The upper and lower ends of the tab 238 are formed to define a clip member 240 and a tab member 242, respectively. The clip member 240 has an initial portion which extends outward of the forward face of the tab 238, initially perpendicular to the forward face of the tab 238. An outer portion of the clip member 240 is formed to turn downward, and extend parallel to the forward face of the tab 238 for retaining between the forward face of the tab 238 and the outer portion of the clip member 240 a web portion of the rack frame 18, which is disposed between adjacent ones of the mounting apertures 19. The tab member 242 extends outward of and at a right angle to the forward face of the tab 238 for extending through one of the apertures 19 of the rack frame 18.

Figure 26:
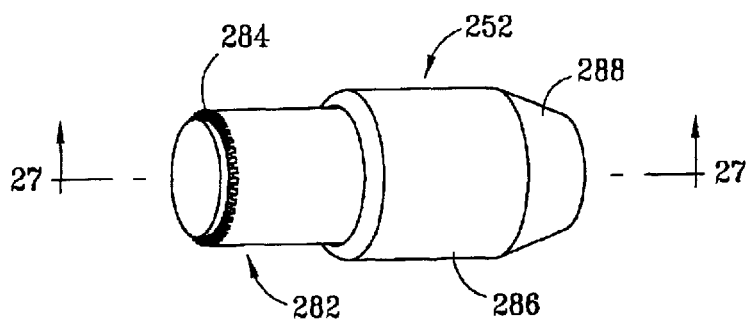
FIG. 26 is a perspective view of one of the tapered plunger latches.

FIG. 26 is a perspective view of one of the latch members 252 having tapered plunger members 286 with a tapered nose 288. The latch member 252 has a cylindrical rearward portion 282 which defines a rearward housing, and a cylindrical forward portion 286 which defines a plunger member having a tapered nose section 288. The rearward end 284 of the rearward portion 282 is knurled to facilitate press fitting to fixedly secure or mount the rearward portion 282 into the mounting holes 236 and 257 (shown in FIGS. 24 and 25). The tapered nose 288 allows the forward end of the latch member 252 to be pressed rearward by the web portion of the rack frame 18 which is between the apertures 19 as the mounting brackets 222 and 224 are secured to the rack frame 18.

Figure 27:
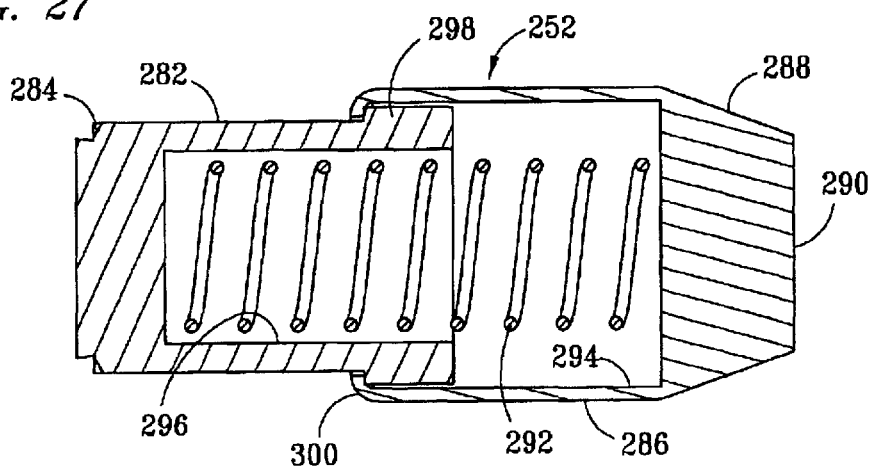
FIG. 27 is a longitudinal section view of one of the tapered plunger latches, taken along section line 27—27 of FIG. 26.

FIG. 27 is a longitudinal section view of the latch member 252, taken along section line 27—27 of FIG. 26. The cylindrical forward plunger portion 286 has the tapered nose 288. The terminal end of the forward nose portion 288 has a planar face 290, which is perpendicular to the longitudinal length of the latch member 252. The tapered nose 288 has sidewalls which taper to reduced diameters in a direction of the end face 290 of the nose 288, from larger diameters at the rearward end 300 of the forward moveable portion 286. The taper of the nose 288 ranges radially inward from ten to forty degrees in a forward direction, as measured from the adjacent sidewall extending to the rearward end 300, and preferably is a radial taper of approximately twenty degrees. A rearward end of the forward, moveable piston portion 286 has a blind hole formed therein to define an interiorly disposed chamber 294, which is open on the rearward end. A second blind hole is formed in the cylindrical housing providing the rearward portion 282 to provide an interiorly disposed chamber 296, which is open on the forward end of the rearward portion 282. A forward end of the rearward portion 282 fits within the rearward-facing opening of the chamber 294 of the forward portion 286, with the rearward portion 282 aligned with the forward portion 282 for the chambers 294 and 296 to together receive a bias spring 292.

The rearward cylindrical housing portion 282 has an outer periphery of a generally cylindrical shape, with a forward end having an enlarged, annular-shaped section which defines a head 298. The head 298 fits within the opening of the chamber 294 of the forward plunger portion 286, and the rearward end section 300 of the forward plunger portion is crimped around the head 298, to retain the forward portion 286 on the rearward portion 282, such that the forward portion 286 is slidably secured to the rearward portion 282 for moving rearward over the head 298 in a lineal, sliding arrangement. Rearward movement of the forward portion 286 over the rearward portion 282 slidably moves the head 398 further within the chamber 294. The bias spring 292 is disposed within the chambers 294 and 296 for urging the rearward portion 282 and the forward portion 286 to move apart, in opposite directions, such that when the rearward end 284 of the rearward portion 282 is fixed in a stationary position, the bias spring 292 will push against the forward portion 286 to urge it to move away from the rearward portion 282.

Figure 28:
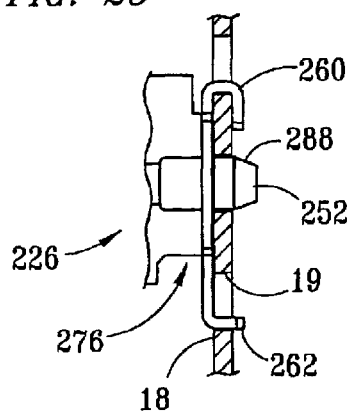
FIG. 28 is a partial, cutaway view of a rack frame with a mounting bracket having a tapered plunger latch secured to the rack frame.

FIG. 28 is a partial, cutaway view of the rack frame 18 with a mounting bracket 226 having the tapered plunger latch 276 secured to the rack frame 18. The plunger latch 276 includes a clip member 260, a tab member 262 and a latch member 252. The clip member 260 extends through an upwardly disposed one of the apertures 19. The tab member 262 protrudes through a lower one of the apertures 19, which is spaced apart from the aperture 19 through which the clip member 260 extends. The tapered nose 288 of the latch member 252 extends through an intermediate one of the apertures 19, which is disposed between the clip member 260 and the tab member 262. The taper of the nose 288 of the latch member 252 facilitates assembly of the latch 226 to the rack frame 18. The tapered nose 288 of the latch member 252 is moved in a lineal direction, that is, a straight line, relative to the mounting rail 212, the mounting bracket 226, the clip member 260 and the tab member 262 in being assembled to the rack frame 18. The moveable section 286 having the tapered nose 288 of the latch member 252 is not moved in angular directions relative to the mounting rail 212 and the mounting bracket 226 when being secured to or removed from the rack frame 18. The lineal movement of the nose 288 of the moveable section 286 of the latch member 252 allows the guide holes 244 and 264 (shown in FIGS. 24 and 25) to be sized to provide vertical structural support, as well as allowing for a closer tolerance fit between periphery of the nose section 286 and the apertures 19 of the rack free 18, to provide greater structural support over latches which employ latch members which move in angular directions, rather than lineally, that is, along a straight line.

Figure 29:
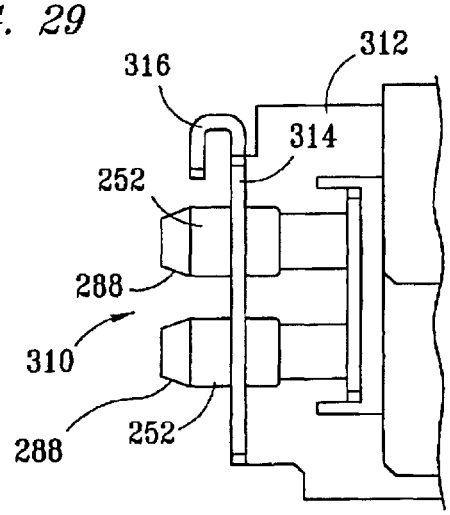
FIG. 29 is an alternative mounting bracket having dual tapered plunger latches.

FIG. 29 is an alternative mounting bracket 310 having a toolless latch provided by latch members 252, for fitting round mounting apertures 319 of a rack frame 318. (See FIG. 30). The latches members 252 each have tapered noses 288, which taper to smaller diameters in outward directions, in which the noses 288 are spring biased to extend toward. The bracket 310 is mounted to a mounting rail 312 and has a guide member 314 having guide holes for guiding the lineal movement of the tapered noses 288 of the latch members 252. The rearward ends of the lath members 252 are fixedly mounted to the mounting rail 312. The upper portion of the guide member 314 is formed to provide a clip member 316 for passing through the apertures 319 and securing to a web between the round apertures 319 of a rack frame 318.

Figure 30:
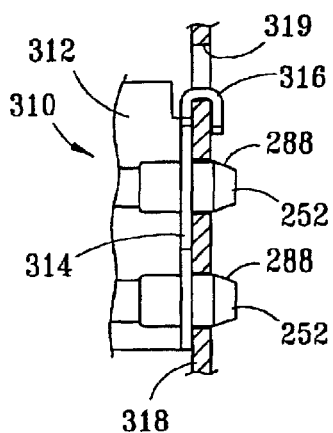
FIG. 30 is a partial, cutaway view of a rack frame having round mounting holes with the alternative mounting bracket having dual tapered plunger latches mounted to the rack frame.

FIG. 30 is a partial, cutaway view of the rack frame 318 having round mounting apertures 319 with the alternative mounting bracket 310 having dual latch members 252 secured to the rack frame 318. The clip member 316 passes through one of the round apertures 319 and secures to a web portion of the rack frame 318 between two of the apertures 319. The noses 288 of the two latch members 252 extend through the guide member 314 and into two of the apertures 319, spaced beneath the aperture 319 in which the clip member 316 is disposed.

Figure 31:
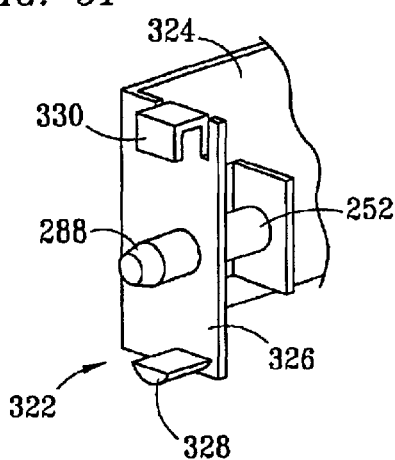
FIG. 31 is an alternative mounting bracket having round mounting posts for securing to rack frames having round mounting apertures.

FIG. 31 is an alternative mounting bracket 322 for securing to the rack frame 318 having the round mounting apertures 319. The mounting bracket 322 has a tapered latch members 252, the rearward end of which is fixedly mounted to a rail 324. A guide member 326 is provided for slidably receiving the tapered nose 288 of the latch member 252. A lower tab 328 is arcuately shaped for fitting within one of the round mounting apertures 319 of the rack frame 318. A clip member 330 extends forward of the guide member 326 for securing to the rack frame 318.

Figure 32:
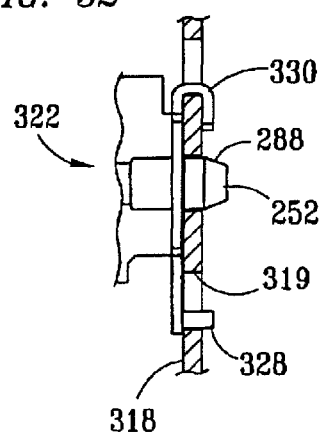
FIG. 32 is a partial, cutaway view of a rack frame having round mounting apertures with the alternative mounting bracket with round mounting posts secured to the rack frame.

FIG. 32 is a partial, cutaway view of the rack frame 318 having the round mounting apertures 319 with the alternative mounting bracket 322 secured thereto. The round-shaped mounting tab 328 and the clip member 330 extend through two spaced apart ones of the round mounting apertures 319. The tapered nose 288 of the latch member 252 extends through one of the apertures 319 which is intermediate of the two apertures 319 through which the mounting tabs 328 and 330 extend.

The present invention provides advantages over the prior art. A drawer for a server system rack includes a moveable tray and a stationary electronic switch which are together mounted to the rack by mounting rails. Telescoping slide rails mount the moveable tray to the mounting rails. A keyboard, a pointing device, and a flat panel display are mounted to the moveable tray. The electronic switch and a power supply are also mounted to the mounting rails. The electronic switch is operable for selectively interconnecting the keyboard, the pointing device and the display of the drawer to various ones of servers used with the server system rack. The electronic switch is mounted in a stationary position which is rearward of the moveable tray, and connects to the keyboard, display and the pointing device, such that only one set of keyboard, display and pointing device cables are required to be connected to the movable tray of the drawer. Such cables are mounted to a cable management arm which extends between the electronic switch and the moveable tray. The cable management arm is provided by a flexible length of molded plastic, having retention tabs molded directly into the length of the molded plastic.

Two lineally sliding latches are provided to provide toolless mounting brackets for securing slide rails of to rack frames. One lineally sliding latch has a latch member is slidably mounted to a mounting bracket for guiding to move lineally by guide tabs engaging within guide apertures. Another slide latch provides a latch member having a tapered plunger member which is moveable. The moveable plunger member has a tapered nose portion, such that the latch is more easily operated for inserting into regularly spaced apertures of a rack frame. The tapered nose of latch is operated by moving the tapered nose in lineal directions relative to a fixedly mounted portion of the latch member. A guide hole is provided for guiding the tapered moveable end nose of the latch member in lineal directions relative to the fixedly mounted portion of the latch member. Moving the latch members lineally allows the latch members to be slidably secured by guide members, strengthening the lineally sliding latches over latches which have latch members which are moved in arcuate directions.

Although the preferred embodiment has been described in detail, it should be understood that various changes, substitutions and alterations can be made therein without departing from the spirit and scope of the invention as defined by the appended claims.

What is claimed is:

1. A cable management arm for securing a cable between a moveable portion or a drawer and a stationary portion of a server system rack, comprising:
    a single member having a main body portion which defines a longitudinal axis;
    a plurality of oppositely disposed grooves formed into opposite sides of said main body portion, said grooves extending transverse to said longitudinal axis and aligned on said opposite sides of said main body portion to define a plurality of hinge regions;
    said hinge regions being spaced apart along said longitudinal axis to define at least two linkages of said single member, adjacent ones of said linkages being pivotally connected by at least a respective one of said hinge regions, and said plurality of linkages together having first and second ends, wherein said first end is fastened to the stationary portion of the server system rack at a first fixed position relative to the rack and said second end is fastened to the moveable portion of the drawer at a second fixed position relative to the moveable portion of the drawer;
    said linkages together extending from said first fixed position to second fixed position as the moveable portion of the drawer is moved relative to the rack; and
    cable retention tabs integrally formed with said single member, said cable retention tabs having first portions and second portions, said first portions extending from said main body portion of said single member and said second portions extending across said main body portion of said single member, spaced apart from said main body portion, for securing the cable to said single member.

2. The cable management arm of claim 1, wherein respective ones of said oppositely disposed grooves are symmetrical about respective central planes of respective ones of said hinge regions of said single member.

3. The cable management arm of claim 2, wherein respective ones of said groove are disposed in a back-to-back alignment.

4. The cable management arm of claim 3, wherein at least a first part of said grooves have generally arcuate shapes, and at least a second portion of said grooves have generally rectangular shapes.

5. The cable management arm of claim 4, wherein outward edges of said grooves are chamfered.

6. The cable management arm of claim 5, wherein said cable retention tabs are L-shaped, with said first portions extending substantially perpendicular to a plane of said main body portion of said single member, and said second portions extending substantially parallel to said plane of said main body portion, in fixed relation to said main body portion.

7. The cable management arm of claim 6, further comprising apertures in said main body portion of said single member disposed adjacent to respective ones of said cable retention tabs.

8. The cable management arm of claim 7, wherein said single member has a cross-section of a channel shape which comprises said main body portion, and opposite edges which define flanges that are perpendicular to said main body portion.

9. The cable management arm of claim 4, wherein said cable retention tabs alternately extend from outside ones of edges of said single member.

10. The cable management arm of claim 1, wherein said second portions of said cable retention tabs extend substantially parallel to said main body portion of said single member, in fixed relation to said main body portion.

11. The cable management arm of claim 10, wherein said cable retention tabs are L-shaped, with said first portions extending substantially perpendicular to said main body portion of said single member, and said second portions extending substantially parallel to said main body portion.

12. The cable management arm of claim 1, further comprising apertures in said main body portion of said single membered disposed adjacent to respective ones of said cable retention tabs.

13. The cable management arm of claim 1, wherein said single member has a cross-section of a channel shape which comprises said main body portion, and opposite edges which are perpendicular to said main body portion to define flanges.

14. A cable management arm for securing a cable between a moveable portion of a drawer and a stationary portion of a server system rack, comprising:
    a single member of molded plastic having a main body portion an elongate shape which defines a longitudinal axis;
    a plurality of oppositely disposed grooves formed into opposite sides of said main body portion of said single member, said grooves extending transverse to said longitudinal axis and aligned on said opposite sides of said main body portion to define a plurality of hinge regions;
    said hinge regions of said single member being spaced apart along said longitudinal axis to define at least two linkages of said single member, adjacent ones of said linkages being pivotally connected by respective ones of said hinge regions, and said linkages together having a first end and a second end, wherein said first end is fastened to the stationary portion of the server system rack at a first fixed position relative to the rack and said second end is fastened to the movable portion of the drawer at a second fixed position relative to the moveable portion; and
    cable retention tabs integrally molded with said single member of molded plastic, said cable retention tabs having first portions and second portions, said first portions extending from said main body portion of said single member of molded plastic and said second portions extending across said main body portion of said single member of molded plastic, spaced apart in fixed relation from said main body portion, for securing said cable to said main body portion of single member of molded plastic.

15. The cable management arm of claim 14, wherein respective ones of said oppositely disposed grooves are disposed in a back-to-back alignment, and are symmetrical about a central plane of respective ones of said hinge regions of said single member of molded plastic.

16. The cable management arm of claim 15, wherein at least a first part of said grooves have generally arcuate shapes and at least a second portion of said grooves have generally rectangular shapes.

17. The cable management arm of claim 16, wherein outward edges of said grooves are chamfered.

18. The cable management arm of claim 15, wherein said cable retention tabs alternately extend from opposite ones of said edges of said single member of molded plastic.

19. The cable management arm of claim 18, wherein said second portions of said cable retention tabs extend parallel to said main body portion of said single member of molded plastic.

20. The cable management arm of claim 19, wherein said cable retention tabs are L-shaped, with said first portions extending perpendicular to said main body portion of said single member of molded plastic, and said second portions extending parallel to said main body portion.

21. The cable management arm of claim 20, further comprising apertures in said main body portion of said single member of molded plastic disposed adjacent to respective ones of said cable retention tabs.

22. The cable management arm of claim 21, wherein said single member of molded plastic has a cross-section of a channel shape which comprises a planar, main body portion and opposite edges which define flanges that are perpendicular to said planar, main body portion.

23. A drawer for a server system rack, comprising in combination:
    a tray;
    telescoping slide assemblies having inner rails and outer rails, said outer rails mounted to the server system rack and said inner rails mounted to said tray to movably secure said tray to the server system rack, such that said tray is movable from an inward position, substantially disposed within the server system rack, to an outward position, extending outward of the server system rack;
    a first cable set which connects from said tray to a stationary portion of the server system rack;
    a single member of molded plastic defining a flexible cable management arm which is secured between said tray and the server system rack, said single member of molded plastic having oppositely disposed grooves formed into opposite sides of said single member of molded plastic, with said grooves extending transverse to a longitudinal axis of said single member of molded plastic to define hinge regions, such that said hinge regions define a plurality of linkages in said single member of molded plastic, said plurality of linkages being pivotally connected by said hinge regions and said plurality of linkages together having a first end and a second end, wherein said first end is pivotally fastened to the server system rack at a first fixed position relative to the rack and said second end is pivotally fastened to said tray at a second fixed position relative to said tray, and wherein said plurality of linkages extend from said first fixed position to second fixed position as said tray is moved between said inward and outward positions relative to the rack; and
    cable retention members integrally molded as part of said single member of molded plastic defining said flexible cable management arm, said cable retention member being defined by L-shaped tabs for securing said first cable set to said flexible cable management arm.

24. The drawer according to claim 23, further comprising:
    an input device and a display mounted to said tray, with said display monitor pivotally mounted to said tray for angularly moving from a downward, storage position into an upright, viewing position;
    stationary mounts secured in fixed relation to said outer rails of said telescoping slide assemblies, rearward of said tray;

an electronic switch mounted to the stationary mounts, said electronic switch selectively operable to connect said keyboard and said flat panel display to selected ones of a plurality of servers;

said first cable set connecting the electronic switch to the input device and the flat panel display;

a plurality of cable sets connecting the plurality of servers to the electronic switch; and a toolless fastener mounted to at least one end of each of said outer rails, said toolless fastener having a latch member with a forwardly extending latch portion which is selectively moveable in a lineal direction to within a rack frame of the server system rack.

25. The drawer according to claim 24, wherein said toolless fastener comprises:

a bracket having an elongated body, a first tab and a second tab which extend transverse to said elongated body, with said first tab being spaced apart from said second tab, said first tab having a slot formed into a side thereof and said second tab being disposed on a terminal end of said elongated body, said second tab having an aperture which is aligned in fixed relation with said slot formed in said first tab;

a latch member having a guide portion which extends adjacent to and slidably engages a planar portion of said elongated body of said bracket, and said latch member further having flange which extends transverse to said guide portion, a post which extends from said flange generally parallel to said guide portion, and a latch tab which extends parallel to said guide portion and outward of said flange, transverse to said flange, said latch member being slidably engaged with said bracket, with said guide portion of said latch member extending adjacent to said planar portion of said elongated body of said bracket, said guide portion of said latch member having an aperture slidably receiving said first tab of said bracket, and said latch tab extending through said aperture in said second tab, and said post extending from said flange of said latch member into said slot in said first tab of said bracket;

a bias member extending between said first tab of said bracket and said flange of said latch member, such that said latch member is urged toward said second member with said latch tab protruding outward of said aperture of said latch tab; and two protuberant members extending from said second tab member of said bracket, in a direction in which said latch tab protrudes from within said aperture of said latch tab, wherein said two protuberant members and said latch tab are lineally aligned to extend in parallel, transverse from a line along which said two protuberant members and said latch tab are lineally aligned, for fitting with regularly spaced apertures of a rack frame of the server system rack.

26. The drawer according to claim 24, wherein said latch member of said toolless fastener comprises a rearward portion and a forward portion which are slidably engaged together, with said rearward portion fixedly secured to one of said outer rails, said forward portion slidably moveable relative to said rearward portion of said latch member, and said forward portion being formed to define said forwardly extending latch portion which is selectively moveable in lineal directions for selectively engaging a rack frame of the server system rack;

a bias spring which extends between said rearward portion and said forward portion of said latch member to urge said forward portion into a forwardly disposed position relative to said rearward portion;

said rearward portion and said forward portion each having generally cylindrical shapes; wherein said forward portion is formed to define a tapered nose section which tapers radially inward at a taper of approximately twenty degrees, from a larger size to a smaller size, in a direction which extends from said rearward portion toward the rack frame of the server system rack; and said forward and said rearward portions having interior chambers which are defined for housing said bias spring, said rearward portion having an outer periphery which, on a forward section thereof, is enlarged to define a head, and said forward portion having a rearward end section which is sized for receiving said head and being crimped around said head to slidably secure said forward portion to said rearward portion.

* * * * *